US010615751B2

(12) United States Patent
Anderson et al.

(10) Patent No.: US 10,615,751 B2
(45) Date of Patent: Apr. 7, 2020

(54) ASYMMETRICAL PARALLEL-COMBINING (APC) TECHNIQUE FOR RF POWER AMPLIFIER

(71) Applicant: DSP Group Ltd., Herzliya (IL)

(72) Inventors: Sergey Anderson, Netanya (IL); Nadav Snir, Tel Aviv (IL)

(73) Assignee: DSP Group Ltd., Herzliya (IL)

( * ) Notice: Subject to any disclaimer, the term of this patent is extended or adjusted under 35 U.S.C. 154(b) by 0 days.

(21) Appl. No.: 16/052,726

(22) Filed: Aug. 2, 2018

(65) Prior Publication Data

US 2019/0058445 A1 Feb. 21, 2019

Related U.S. Application Data

(60) Provisional application No. 62/688,392, filed on Jun. 22, 2018, provisional application No. 62/548,394, filed on Aug. 21, 2017.

(51) Int. Cl.
*H03F 3/68* (2006.01)
*H03F 1/02* (2006.01)
*H03F 3/195* (2006.01)
*H03F 3/60* (2006.01)
(Continued)

(52) U.S. Cl.
CPC ....... *H03F 1/0288* (2013.01); *H01F 27/2804* (2013.01); *H03F 3/195* (2013.01);
(Continued)

(58) Field of Classification Search
CPC .............. H03F 3/68; H03F 2200/534; H03F 2200/537; H03F 2200/541
USPC ................................................. 330/195, 276
See application file for complete search history.

(56) References Cited

U.S. PATENT DOCUMENTS

| | | | |
|---|---|---|---|
| 9,667,199 B1* | 5/2017 | McLaren | H03F 1/0288 |
| 2012/0201258 A1* | 8/2012 | Bendixen | H03F 3/195 |
| | | | 370/542 |
| 2018/0006618 A1* | 1/2018 | Mohta | H04B 1/0458 |

OTHER PUBLICATIONS

K. N. ManjulaRani, et al., "Hot-carrier reliability study and simulation methodology development for 65nm technology", IEEE International Integrated Reliability Workshop Final Reports, pp. 124-127, 2009.

(Continued)

*Primary Examiner* — Steven J Mottola
(74) *Attorney, Agent, or Firm* — Reches Patents

(57) ABSTRACT

An integrated circuit RF power amplifier that includes a substrate; a low power (LP) amplifier; a high-power (HP) amplifier; and an asymmetrical parallel-combining transformer. The substrate is configured to supports the LP amplifier, the HP amplifier and the asymmetrical parallel-combining transformer. The LP amplifier is configured to amplify a LP RF input signal to provide a LP amplified signal. The HP amplifier is configured to amplify a HP RF input signal to provide a HP amplified signal. The HP amplified signal has maximal intensity that exceeds a maximal intensity of the LP amplified signal. The wherein the asymmetrical parallel-combining transformer may include (a) a HP primary winding that is constructed and arranged to receive the HP amplified signal; (b) LP primary windings that are constructed and arranged to receive the LP amplified signal; and (c) secondary windings that are magnetically coupled to the HP primary winding and to the LP primary windings, and are constructed and arranged to output a output signal.

19 Claims, 35 Drawing Sheets
(32 of 35 Drawing Sheet(s) Filed in Color)

(51) Int. Cl.
  *H03F 3/45* (2006.01)
  *H01F 27/28* (2006.01)
  *H03G 1/00* (2006.01)

(52) U.S. Cl.
  CPC ..... *H03F 3/45179* (2013.01); *H03F 3/45475* (2013.01); *H03F 3/604* (2013.01); *H01F 2027/2809* (2013.01); *H03F 2200/534* (2013.01); *H03F 2200/537* (2013.01); *H03F 2200/541* (2013.01); *H03F 2203/45302* (2013.01); *H03F 2203/45621* (2013.01); *H03G 1/0029* (2013.01)

(56) References Cited

OTHER PUBLICATIONS

J. Kim, et al., "A Linear Multi-Mode CMOS Power Amplifier with Discrete Resizing and Concurrent Power Combining Structure", ISSCC, vol. 46, No. 5, May 2011.

S. Kang, et al., "A 5-GHz WiFi RF CMOS Power Amplifier with a Parallel-Cascoded Configuration and an Active Feedback Linearize", IEEE Transactions on Microwave Theory and Techniques, vol. 65, pp. 3230-3244, Apr. 2017.

W. Ye, et al., "A 2-to-6GHz Class-AB Power Amplifier with 28.4% PAE in 65nm CMOS Supportsing 256QAM", ISSCC, pp. 38-40, Apr. 2015.

J. Park, et al., "A CMOS Antiphase Power Amplifier With an MGTR Technique for Mobile Applications", IEEE Transactions on Microwave Theory and Techniques, vol. 65, No. 11, pp. 4645-4656, 2017.

V. Camarchia, et al., "The Doherty power amplifier: Review of recent solutions and trends", IEEE Transactions on Microwave Theory and Techniques, vol. 63, No. 2, pp. 559-571, 2015.

S. Modi, et al., "Efficiency improvement of Doherty power amplifiers using supply switching and gate bias modulation." WAMICON 2014.

\* cited by examiner

ASYMMETRICAL PARALLEL-COMBINING (APC) TECHNIQUE FOR RF POWER AMPLIFIER

CROSS REFERENCE

This application claims priority from U.S. provisional patents Ser. No. 62/548,394 filing date Aug. 21, 2017 and from U.S. provisional patents Ser. No. 62/688,392 filing date Jun. 22, 2018, both being incorporated herein by reference.

BACKGROUND OF THE INVENTION

The following reference provide some information about the state of the art:
[1] K. N. ManjulaRani, et al., "Hot-carrier reliability study and simulation methodology development for 65 nm technology", IEEE International Integrated Reliability Workshop Final Reports, pp. 124-127, 2009.
[2] J. Kim, et al., "A Linear Multi-Mode CMOS Power Amplifier with Discrete Resizing and Concurrent Power Combining Structure", ISSCC, Vol. 46, No. 5, May 2011.
[3] S. Kang, et al., "A 5-GHz WiFi RF CMOS Power Amplifier with a Parallel-Cascoded Configuration and an Active Feedback Linearize", IEEE Transactions on Microwave Theory and Techniques, Vol. 65, pp. 3230-3244, April 2017.
[4] W. Ye, et al., "A 2-to-6 GHz Class-AB Power Amplifier with 28.4% PAE in 65 nm CMOS Supporting 256QAM", ISSCC, pp. 38-40, April 2015.
[5] J. Park, et al., "A CMOS Antiphase Power Amplifier With an MGTR Technique for Mobile Applications", IEEE Transactions on Microwave Theory and Techniques, Vol. 65, No. 11, pp. 4645-4656, 2017.
[6] V. Camarchia, et al., "The Doherty power amplifier: Review of recent solutions and trends", IEEE Transactions on Microwave Theory and Techniques, Vol. 63, No. 2, pp. 559-571, 2015
[7] S. Modi, et al., "Efficiency improvement of Doherty power amplifiers using supply switching and gate bias modulation." 2014 IEEE 15th Annual Wireless and FIG. 1 is a graph 10 that illustrates the relationships between output power, bandwidth (BW), EVM and PAE of various prior art power amplifiers such as PCT, PCC, MGTR, Doherty and switching mode.

In the recent decade there has been a strong demand to use CMOS technologies when implementing RF power amplifiers as part of a transceiver or a front-end module for the IEEE 802.11ac/ax WiFi standards. However, CMOS technologies are notorious for their poor linearity and inadequate protection from voltage and current stresses [1], which usually cause reliability and breakdown problems for WiFi access points where the PA is supplied by 3 to 5V.

In addition to minimization of the PA's power consumption, it is also desirable to achieve high efficiency at power back-off (PBO) in it, while keeping low levels of AM-AM and AM-PM distortions for a targeted EVM performance of −35 dB, preferably without digital pre-distortion (DPD) mechanisms of high-complexity.

There are several well-known approaches to address this in order to design highly-efficient, highly-linear CMOS PAs, while avoiding voltage and current stress in the CMOS transistors. The cascode transistor configuration is widely used in order to reduce the voltage stress over the CMOS transistors. However, it is also very important to reduce the current density in the transistors.

Using switching mode power amplifiers or highly efficient topologies, such as Doherty, allows the PA to reach high PAE in the deep PBO region, as shown in FIG. 1.

However, these solutions require a DPD engine, phase shifters and programmable higher-Q resonant tank circuits to correct for the PA nonlinearity over the targeted output power and operating frequency ranges.

Techniques such as parallel-combining transformer (PCT) [2], parallel-cascoded configuration (PCC) with active feedback linearizer [3] and multigate transistor (MGTR) [5], can all improve the linearity of the PA, but will increase its power consumption when achieving the targeted EVM performance of −35 dB because the cascode transistors are connected to the same load.

A combination of the above techniques allows us to achieve enhanced performance of the RF power amplifier. However, the disadvantages of the combination are the complexity of the algorithms and calibration tests; reduced output power; increased size of the hardware or increased power consumption due to the additional look-up table.

Therefore, a new PA topology is needed, which would allow us to control and improve all the important parameters at once, such as bandwidth, output power, efficiency and EVM.

SUMMARY

There may be provided a power amplifier and a method as illustrated in the specification, and/or claims and/or drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The present invention will be understood and appreciated more fully from the following detailed description taken in conjunction with the drawings in which.

DETAILED DESCRIPTION OF THE DRAWINGS

Any reference to a power amplifier should be applied mutatis mutandis to a method executable by the power amplifier.

Any reference to a method should be applied mutatis mutandis to a power amplifier that is constructed and arranged to execute the method.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the following specification, there will be provides specific examples of embodiments. It will, however, be evident that various modifications and changes may be made therein without departing from the broader spirit and scope of the invention as set forth in the appended claims.

There may be provided an integrated circuit radio frequency (RF) power amplifier (hereinafter—power amplifier) that has an asymmetrical Parallel-Combining (APC) Cascode topology. An example of the power amplifier was tested under certain non-limiting conditions—for example it was demonstrated in under WiFi 802.11ac conditions operating at 5 GHz band.

It is noted that the illustrated power amplifier may work other conditions—and exhibits a performance that differs from those illustrated below. This example power amplifier was shown to offer enhancements in both linearity, achieving an error vector magnitude (EVM) below −35 dB, as well as in efficiency, achieving power-added efficiency (PAE) of 4.6% at an output power level of 17.6 dBm and supply voltage of 5V. The example power amplifier proposed low-complexity design covers the entire 802.11ac band without tunable elements, multigate transistors (MGTR), digital pre-distortion (DPD), load modulation or negative feedback control, thereby providing a very robust and cost-effective solution. The example power amplifier was implemented in a 55 nm CMOS process on a 0.76 mm×1.26 mm die and assembled in a 16-lead QFN (3 mm×3 mm) package. The power amplifier may be manufactured by other manufacturing processes using other manufacturing parameters.

There is provided a power amplifier that employs an asymmetrical parallel-combining (APC) technique, which improves linearity (reduces AM-AM and AM-PM distortions), while also reducing the current consumption and increasing the PBO efficiency.

Power Amplifier Architecture

Figure 1:
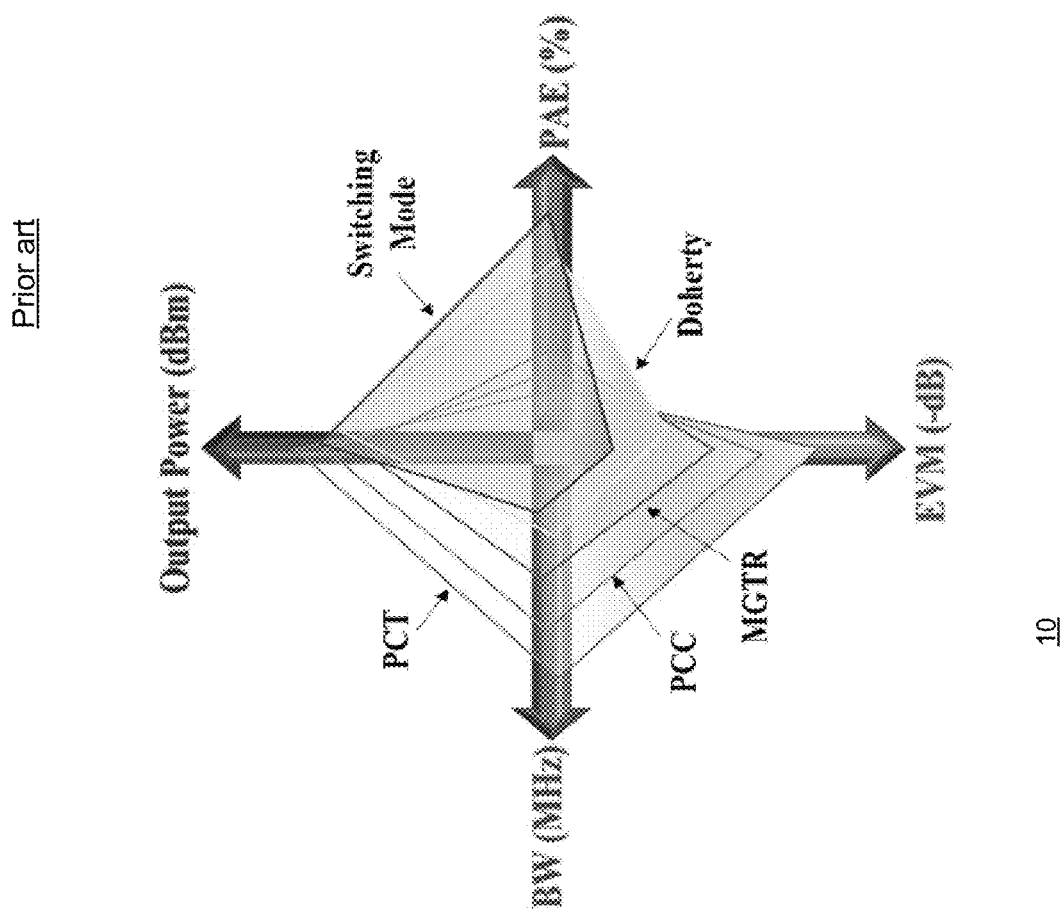
FIG. 1 is an example of performances of prior art power amplifiers.
Figure 2:
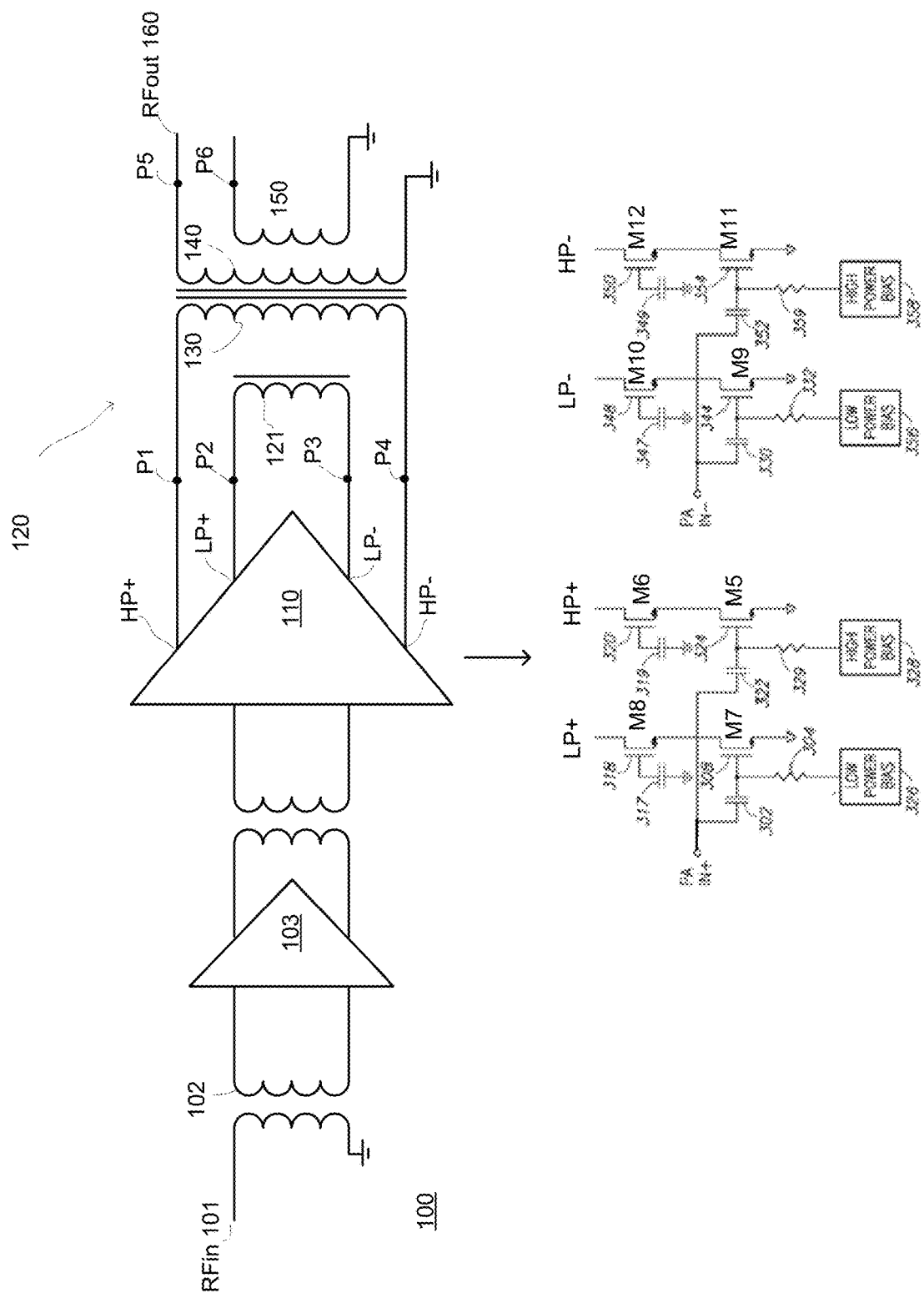
FIG. 2 is an example of a power amplifier.

The proposed topology, shown in FIG. 2, uses a combination of two amplifiers (low-power and high-power)—that are included in a PA output stage 110—that are connected to an asymmetrical parallel-combining transformer 120 with different impedance for each amplifier, whose activity is controlled dynamically using an input RF signal and a set of different external biases.

The suggested power amplifier may include a set of external biases that is static—but may include a set of external biases that allow dynamic compensation for changes in the parameters of the power amplifier that may result from process, voltage and temperature variations (PVT). The power amplifier may include on either a configurable bias circuit or a scaled replica in a closed loop to compensate for PVT variations.

The Doherty power amplifier is another popular technique [6] [7] where an auxiliary power amplifier supplements the main power amplifier at high output power by changing the reactance of the load (active load-pull effect). However, there are fundamental differences between the operation of a Doherty power amplifier and the proposed APC technique.

Doherty power amplifiers keep the overall efficiency high at PBO through active load-pull using a λ/4 impedance inverter transformer at the output. When its auxiliary power amplifier is activated, the load-pull effects in the Doherty power amplifier cause significant AM-AM and AM-PM distortions that need to be compensated, generally with pre-distortion.

In contrast, the suggested power amplifier combines two separate paths, where the low-power amplifier is connected to a constant high impedance load and the high-power amplifier to a constant low impedance load. These amplifiers should have optimum load-pull values and optimum coupling to avoid load-modulation effects between them, and at the same time to achieve the compensation effect of reverse slopes of AM-AM and AM-PM distortions at different power regions of operation.

The operation class and performance of the low power and high power amplifiers depend on several parameters of the amplifiers, such as input power, quiescent operation point, transconductance of the transistors and load ratios. Increasing the ratio of the transistor sizes of the amplifiers and their load ratios improves the total PAE, but also increases the AM-AM and AM-PM distortions. On the other hand, reducing these ratios has the opposite effect on the PAE and improves the linearity of the power amplifier.

Figure 4:
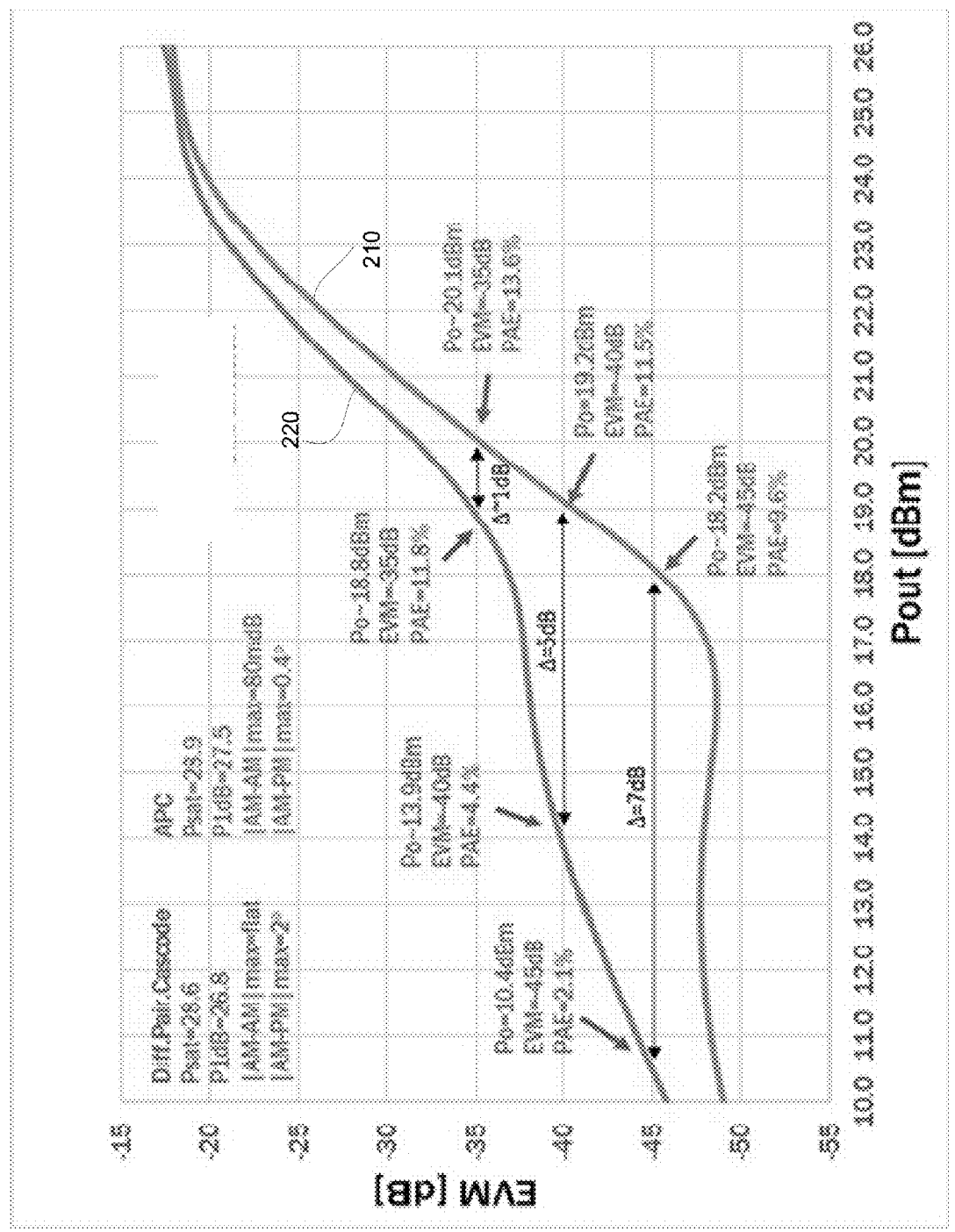
FIGS. 4-8 are examples of performances of one or more power amplifiers.

By employing appropriate power amplifier's parameters and biases the suggested power amplifier provides better EVM performance than the Differential Paired Cascode, as shown in FIG. 4.

For the same EVM level, using the suggested power amplifier can achieve higher output power and better power added efficiency compared to the Differential Pair Cascode.

FIG. 4 includes graph 200 that illustrates performances of the suggested power amplifier (curve 210) versus A differential pair Cascode (curve 220).

Figure 5:
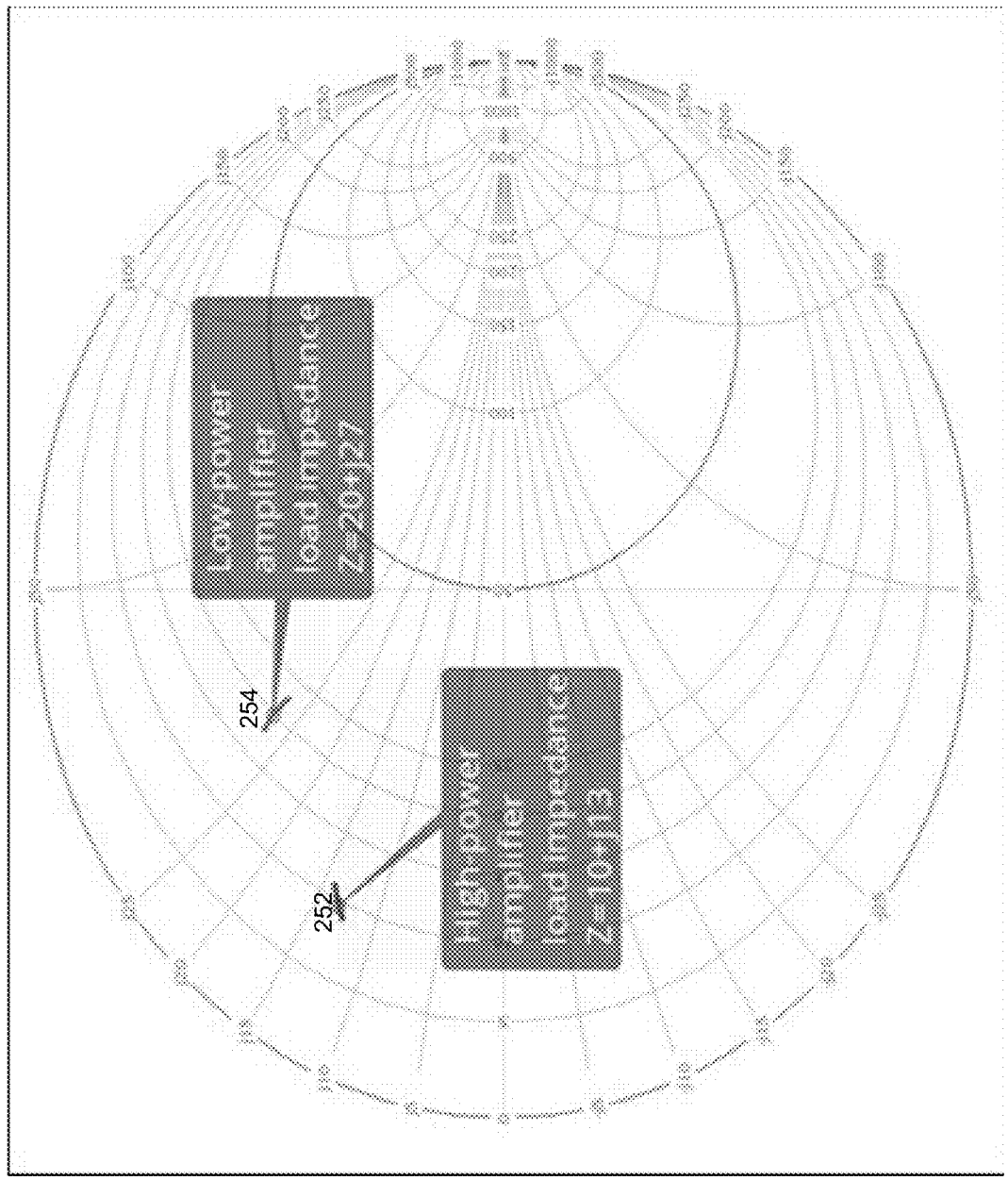

It was inferred from simulation results (conducted on an example of the suggested power amplifier) that in order to achieve an output power close to +17 dBm and EVM performance below −35 dB for the same input power and the same size of the transistors at both (HP amplifier load impedance 252 versus LP amplifier load impedance 254) the low- and high-power amplifiers, the ratio of the loads had to be kept at almost 2×, as is shown in the Smith chart in FIG. 5.

As a result, the low-power amplifier is efficient in small signal mode and the high-power amplifier is efficient in large signal mode. It should be noted that the suggested power amplifier achieves a flat power gain response over the band (1 GHz in our case) and does not require a λ/4 transformer or 90 deg. phase shifter, which are inherently narrowband elements.

Implementation of the Suggested Power Amplifier

The circuit schematics of the suggested power amplifier is shown in FIG. 2.

The asymmetrical parallel-combining transformer includes one or more LP primary windings 121, a HP primary winding 130 and two separate secondary windings 140 and 150—that terminate in two output ports. It should be noted that the coupler illustrated in FIG. 2 as well as the secondary winding 150 are optional. FIG. 2 illustrates RF source 101 that is followed by an input transformer, an input driver 103 for performing an initial amplification of the input RF signal and another transformer. The input driver 103 is optional. The input driver may operate as a pseudo-differential cascode amplifier in the linear class-AB region, and delivers its output power to the output power stage through the transformer, which provides power matching for both driver outputs and PAs input transistors.

The first group of low-power cascodes of the power amplifier, implemented by transistors M7-M10 308, 318, 344 and 348, is connected to the low-power coil ports P2 and P3 at the output transformer, and operates as a class-AB pseudo-differential cascode amplifier. The second group of high-power cascodes of the power amplifier, consisting of transistors M5 324, M6 320, M11 354, and M12 350, is connected to the high-power coil ports P1 and P4 at the output transformer, and operates as a class-C pseudo-differential cascode amplifier. The sizes of the low-power and high-power amplifiers were chosen to be equal for the sake of simplification of the layout design. However, it is preferable to make the transistor's sizes and their load ratios different in order to increase the PBO efficiency of the power amplifier. In FIG. 2 M5 324 was independently biased by high power bias circuit 328, M7 308 was independently biased by low power bias circuit 326, M9 344 was independently biased by low power bias circuit 356, M11 354 was independently biased by high power bias circuit 358. This figure also illustrates capacitors 302, 317, 319, 322, 330, 347, 349 and 352 coupled to the gates of transistors M5-M11.

Examples of power amplifier stages—especially various biasing schemes for independently biasing a LP amplifier and a HP amplifier, and/or various schemes for independently biasing different branches of a power amplifier and using transistors of the same threshold or of different thresholds—are illustrated in US patent application 2017/0070199—especially in FIGS. 12A, 13A, 14, 78 and 80—which are incorporated herein by reference.

Figure 3:
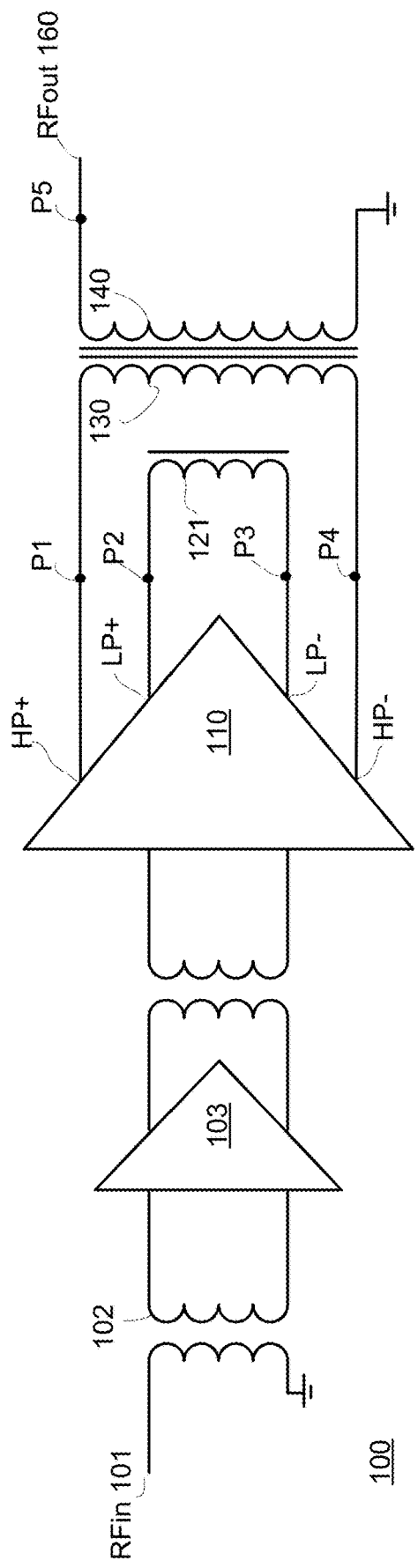
FIG. 3 is an example of a power amplifier.

FIG. 3 illustrates a power amplifier in which the secondary winding 150 was omitted.

Simulation and Measurement results of the example of the power amplifier

Figure 6:
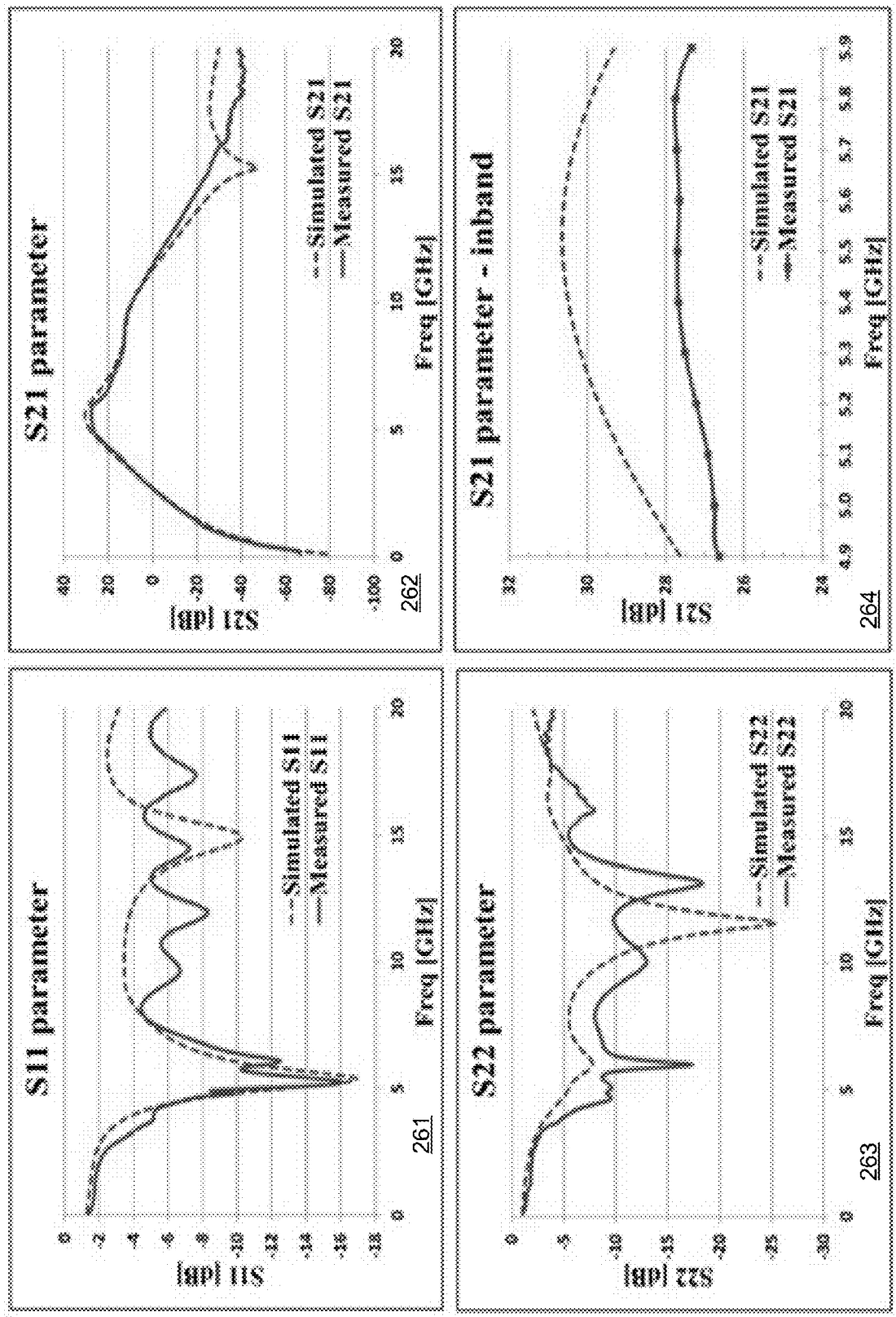
Figure 7:
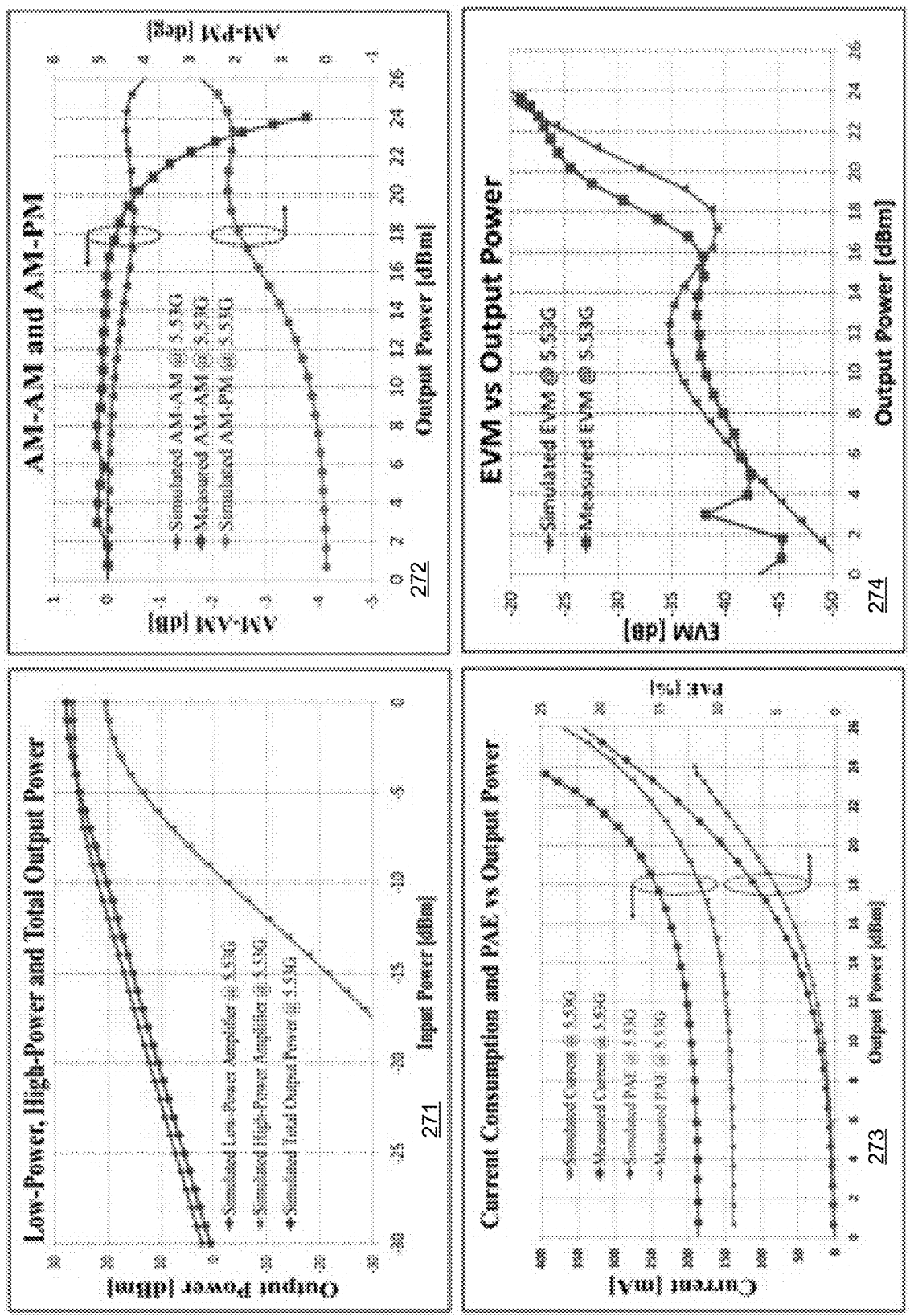

Small-signal and large signal simulation and measurement results are presented (graphs 261, 262, 263 and 264) in FIG. 6 and FIG. 7 (graphs 271, 272, 273 and 274), respectively. The measurement results show a gain of 27 dB with flatness of ±0.6 dB in the frequency range of 4.9 GHz to 5.9 GHz. The input return loss is below −10 dB and the output return loss is −9 dB.

As shown in FIG. 6, while the simulation results for the small signal parameters anticipate a flat response over the frequency band, the measurement results exhibit substantial in-band amplitude ripple, which is caused by the custom 5V ESD protection devices connected to the I/O ring pads.

A combination of ESD parasitic capacitances and down-bond wires create parasitic resonances, which degrade the EVM performance of the power amplifier. One of the possible solutions to parasitic resonances is to use power-cuts for the ESD ring and create models for custom 5V ESD devices.

It should be pointed out that there is a cross-coupling effect between the low-power and high-power amplifiers, which reduces the power gain of the amplifiers. Additional losses in the transformer are created by an integrated coupler for the external power detector, which is not used for the power amplifier control, but has been designed in response to market demand.

Another advantage of the APC technique is that may separately varies the biasing voltage at both the common-source and common-gate transistors at each cascode. It allows to separately and more accurately control the operation classes of both the low-power and high-power amplifiers and thus find their optimal crossing point in order to simultaneously reduce the AM-AM distortion to less than 0.5 dB and the AM-PM distortion to less than 1.7 deg., as shown in FIG. 7.

Due to different biasing and different loads connected to the cascodes, the transconductances gm1, gm3 and gm5 of the two groups of cascodes are different. Consequently, the amplitude and phase of the intermodulation products IMD3 and IMD5 are different too. The compensation for AM-AM and AM-PM distortions is done inside the asymmetrical parallel combiner by summation of responses of the low- and high-power amplifiers. That achieves both linearization and efficiency enhancement at deep PBO in the power amplifier.

The example APC power amplifier achieved 17.6 dBm output power with 4.6% PAE without any DC/DC converter or power supply modulation circuit, while supplied directly by VCC=5V with power consumption below 1.1 Watt. The current density in the transistors of the example power amplifier is 0.043 mA/μm for the driver and 0.026 mA/μm for the PA output stage at the quiescent DC operation point.

Figure 8:
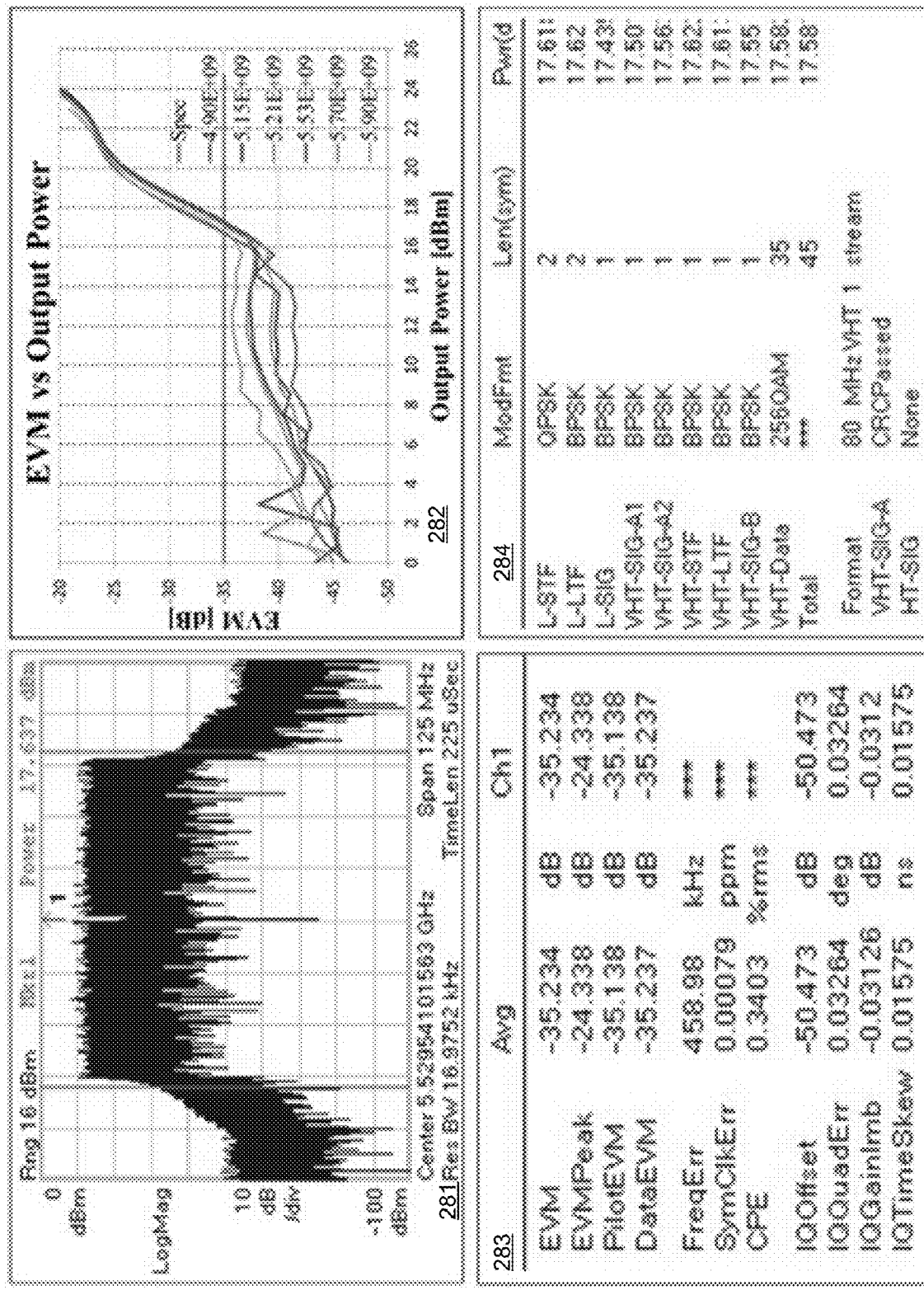

The advantages of the APC topology are also reflected in the EVM performance over the frequency band and in the spectrum mask measurement results shown in FIG. 8 (graphs 281, 282, 283 and 284). The EVM of the PA is shown to have reached −35 dB while passing the IEEE spectral mask with at least 7 dB margin for a wideband modulated signal per the OFDM Wi-Fi 802.11ac standard (80 MHz MCS9 256-QAM). The measured Psat of the PA is 27.6 dBm at 5.53 GHz.

The performance of the power amplifier and comparison with prior art CMOS RF power amplifiers are shown in Table 1, indicating that the example of the power amplifier provides higher output power than that of the PCC and PCT techniques by 2 dB or more, while maintaining an EVM performance at or below −35 dB without DPD. Although the power consumption of the example of the power amplifier is higher than that of the PCC based PA, it provides a power gain greater than 15 dB while being supplied by VCC=5V.

Table 1 illustrates a performance summary and comparison.

| PA Perfromance | Unit | This Work | [2] | [3] | [4] |
| --- | --- | --- | --- | --- | --- |
| Technology | | 55 nm CMOS | 180 nm CMOS | 0.13 um CMOS | 65 nm CMOS |
| PA Architecture | | APC | PCT | PCC and AFL | Class-AB |
| PA Supply Voltage | V | 5 | 3.3 | 3.6 | 3.3 |
| Power Consumption | Watt | 1.1 | 1.95 | 0.47 | — |
| Tunable Elements | | No | Yes | No | No |
| Output Coupler (AGC) | | Yes | No | No | No |
| Operating Frequency | GHz | 4.9-5.9 | 2.5 | 5.15-5.85 | 2-6 |
| Gain | dB | 27.6 | 31.3 | 12 | 23.6 |
| RF Signal Modulation BW | MHz | 80 | 10 | 80 | 80 |
| Signal Modulation | | MCS9 256QAM | OFDM 64-QAM | 256QAM | 256QAM |
| Output Power @ EVM = −35 dB | dBm | 17.6 | 15 | 15.6 | 5.7 |
| PAE @ Pout | % | 4.2 | 1.6 | 7.5 | — |
| Package | | QFN 3 × 3 | — | — | — |

Figure 34:
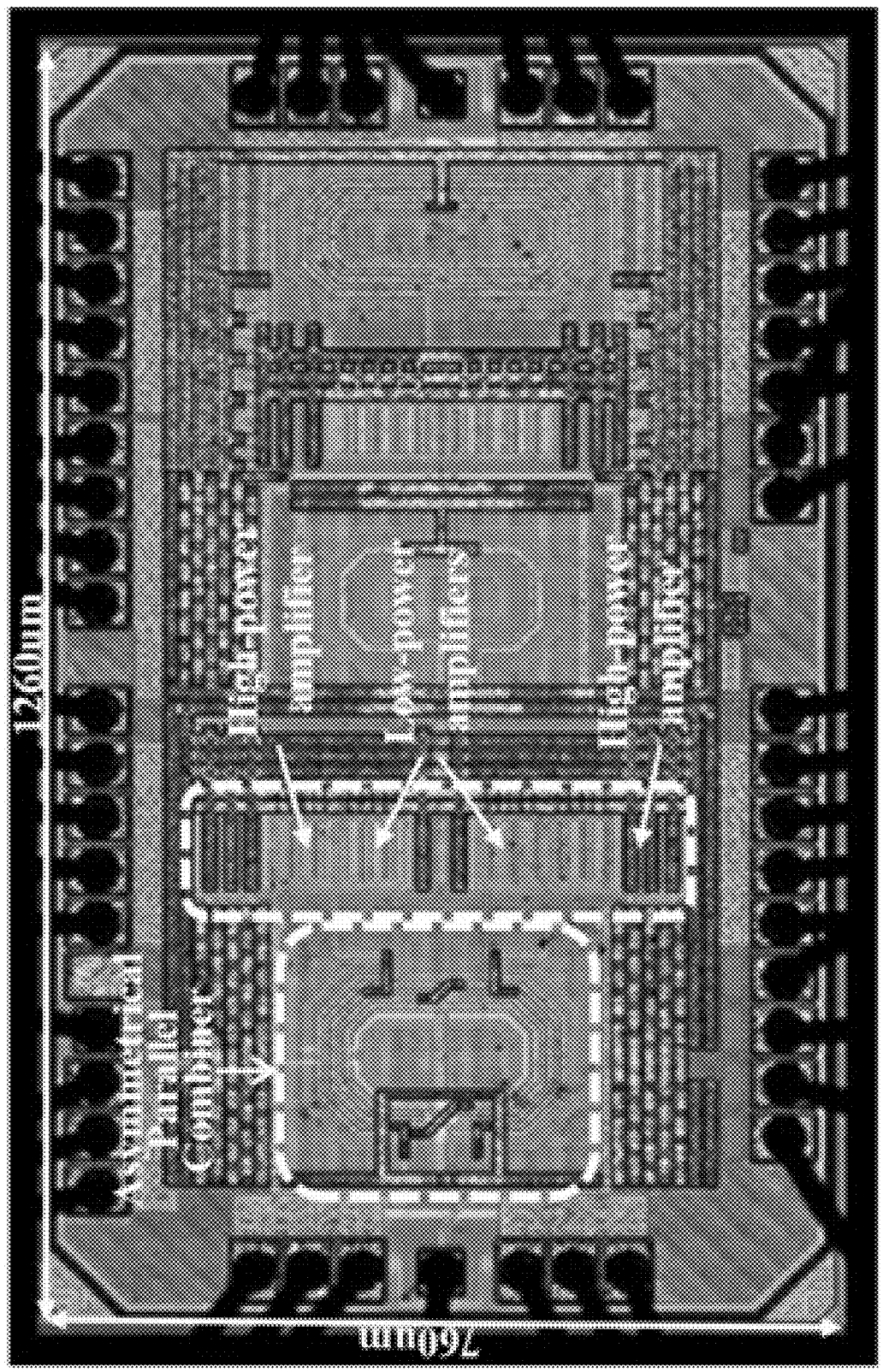
FIG. 34 illustrates an example of a layout of an integrated circuit.

Fabricated using a TSMC 55 nm bulk process, the die of the example power amplifier occupied an area of 0.76 mm×1.26 mm (including pads), as shown in the micrograph in FIG. 34. The die was packaged in a 3×3 mm standard QFN package and mounted on an evaluation board. Measurement results include the insertion loss of the SMA connectors, the board traces and the package's bond wires.

The example of the power amplifier, was demonstrated at a 17.6 dBm output power with a power-added efficiency of 4.6% at a 5V voltage supply. Moreover, the power amplifier allows the CMOS core and I/O transistors to be protected from voltage and current stress, to exhibit minimal AM-AM and AM-PM distortions and to achieve output power flatness while keeping (in case of the example power amplifier) EVM below −35 dB over the entire frequency band of the Wi-Fi 802.11ac standard. Comparison with previously published work shows 2 dB improvement in output power of the example of the power amplifier while delivering 27 dB of power gain.

Measurement results validated that the performance meets the requirements of 802.11ac access points and confirmed the benefits of the suggested power amplifier in reducing current stress with a low complexity design that does not require DPD, tunable elements, multi gate transistors, negative feedback control or load modulation techniques.

This suggested power amplifier could additionally be combined with other existing power amplifier topology to achieve an even better overall PA performance.

There may be provided an integrated circuit radio frequency (RF) power amplifier, that may include a substrate, a low power (LP) amplifier, a high-power (HP) amplifier; and an asymmetrical parallel-combining transformer.

The substrate may be configured to supports the LP amplifier, the HP amplifier and the asymmetrical parallel-combining transformer.

The LP amplifier may be configured to amplify a LP RF input signal to provide a LP amplified signal.

The HP amplifier may be configured to amplify a HP RF input signal to provide a HP amplified signal.

Figure 9:
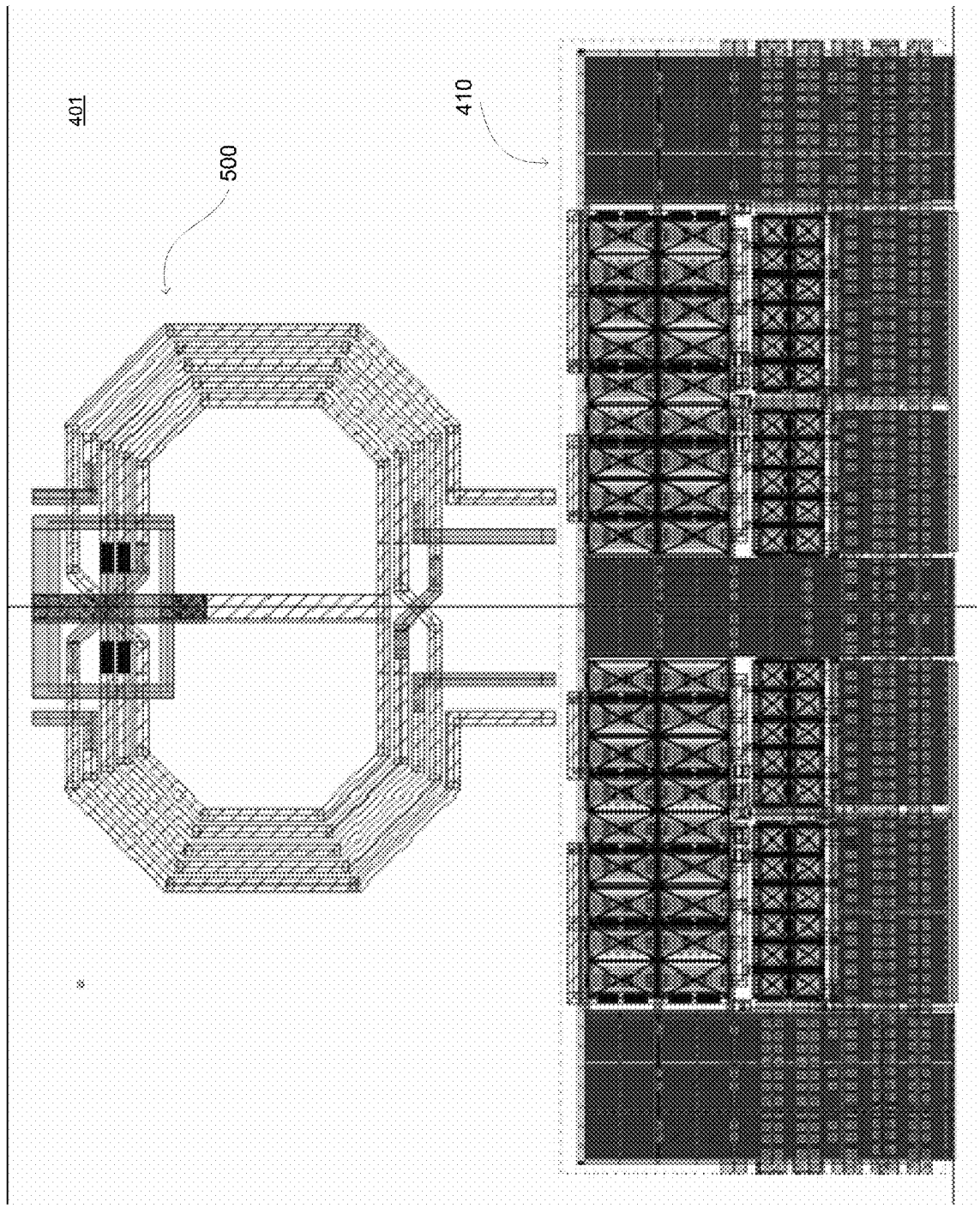
FIG. 9 illustrates an example of a layout of an integrated circuit.

FIG. 9 illustrates an example of an integrated circuit RF power amplifier 400 that includes a substrate 401, active components (HP amplifier and LP amplifier) 410 and passive components (asymmetrical parallel-combining transformer) 500.

The HP amplified signal. may have a maximal amplitude than is higher that maximal amplitude of the LP amplified signal.

The asymmetrical parallel-combining transformer may include:
  a. A HP primary winding that may be constructed and arranged to receive the HP amplified signal.
  b. LP primary windings that may be constructed and arranged to receive the LP amplified signal.
  c. Secondary windings that may be magnetically coupled to the HP primary winding and to the LP primary windings, and may be constructed and arranged to output a output signal.

The LP primary windings provide such a load for the LP amplifier that it becomes optimized for very low current consumption in the region below power back-off (PBO) of the power amplifier.

Conversely, the HP primary winding may supports only the HP amplifier in the PBO region and may be optimized for signal amplitude peaks.

There may be multiple HP primary windings—but the number of HP primary windings should differ from the number of LP primary windings.

The LP amplifier and the HP amplifier may be independently biased.

The LP amplifier may include a pair of LP amplification branches for amplifying the LP RF input signal. The HP amplifier HP may include a pair of HP amplification branches for amplifying the HP RF input signal. The pair of LP amplification branches may be independently biased. The pair of HP amplification branches may be independently biased.

The HP primary winding, the LP primary windings, and the secondary windings may surround each other. Especially—the vertical projections (on the substrate) of the HP primary winding, the LP primary windings, and the secondary windings may surround each other—as one or more windings (or one or more winding parts—or windings interconnects) may be located at different layers.

Table 2 and FIGS. 10-33 illustrate six different types of an asymmetrical parallel-combining transformer. The first, third, fourth, fifth and sixth types include five windings each. The second type includes six windings.

It should be noted that the asymmetrical parallel-combining transformer may include a different number of windings.

In these figures the windings are of an octagonal shape. It should be noted that the windings may have any other shape—for example, any other polygon, any ellipse or circle, and the like.

In these figures each winding include eight linear segments that are connected to each other. Winding of the same type are connected to each other by interconnects. Winding of the same type may be located at the same layer and/or at different layers. The interconnects may be located at a different layers from the windings.

A certain winding is considered to surround (fully or almost fully) another winding when the vertical projection (on the substrate) of the certain winding (and even an interconnect connected to the certain winding) surround the vertical projection (on the substrate) of the other winding (and even an interconnect connected to the other winding).

It should be noted that each winding may have any number of segments, and that the segments may be of any shape.

It FIGS. 9-33 all windings have a similar shape (or the same shape)—but one winding may differ from another winding by shape.

The asymmetrical parallel-combining transformer may include windings that surround each other. The asymmetrical parallel-combining transformer may include one or more external windings, intermediate windings and one or more inner winding.

Different types of asymmetrical parallel-combining transformers may differ from each other by at least one out of:
  a. The allocation of windings between (corresponding to the relative position of) the HP primary winding, LP primary windings and secondary windings.
  b. The power interface for feeding power to the HP primary winding and/or to the LP primary winding.
  c. The number of layers that are allocated to the windings.

The HP primary winding is not connected to the LP primary windings and is not connected to the secondary windings. The LP primary windings are not connected to the secondary windings.

The secondary windings are magnetically coupled to the HP primary winding and to the LP primary windings.

Table 2 illustrates six types of asymmetrical parallel-combining transformer.

| Type | Primary HP winding | Primary LP windings | Secondary secondary windings | HP power supply | Location and/or type of LP power supply |
|---|---|---|---|---|---|
| 1 | Single external primary winding | Two primary windings- including the inner primary winding | Two intermediate secondary windings | First side | Second side |
| 2 | Single external primary winding | Three primary windings - including the inner primary winding | Two intermediate secondary windings | First side | First side |
| 3 | Single external primary winding | Two primary windings- including the inner primary winding | Two intermediate secondary windings | First side | A frame located at the first side that is coupled via a conductor to the middle of the inner primary winding |
| 4 | Single intermediate primary winding | Two primary windings- including the external primary winding | Two inner secondary windings - one above the other | First side | A conductor that is fed at the first side that is coupled to the middle of an intermediate primary winding |
| 5 | Single inner primary winding | Two primary windings- including the external primary winding | Two intermediate secondary windings | First side | A conductor that is fed at the first side that is coupled to the middle of an intermediate primary winding |
| 6 | Single external winding | Two windings- including the inner winding | Two intermediate secondary windings | First side | A conductor that is fed at the first side that is coupled to the middle of an inner primary winding |

In FIGS. 10-33 the following reference numbers have the following meaning:

| | |
|---|---|
| 510 | First winding - the innermost winding |
| 520 | Second winding - the second innermost winding (except the second type in which the first and second windings are the inner most windings) |
| 530 | Third winding - the third innermost winding |
| 540 | Fourth winding - the fourth innermost winding |
| 550 | Fifth winding - the fifth innermost winding (in first and third till sixth types- the external winding) |
| 560 | Sixth winding - the sixth innermost winding (in the second type - the external winding) |
| 562 | LP input ports |
| 564 | HP input ports |
| 566 | Output ports |
| 570 | HP power interface |
| 580 | LP power interface |
| 582 | Frame |
| 584 | Line like conductor |
| 586 | Line like conductor that extends over the windings |
| 591 | LP windings interconnect - connected between different LP primary windings |
| 592 | Secondary windings interconnect - connected between different secondary windings |

First Type

Figure 10:
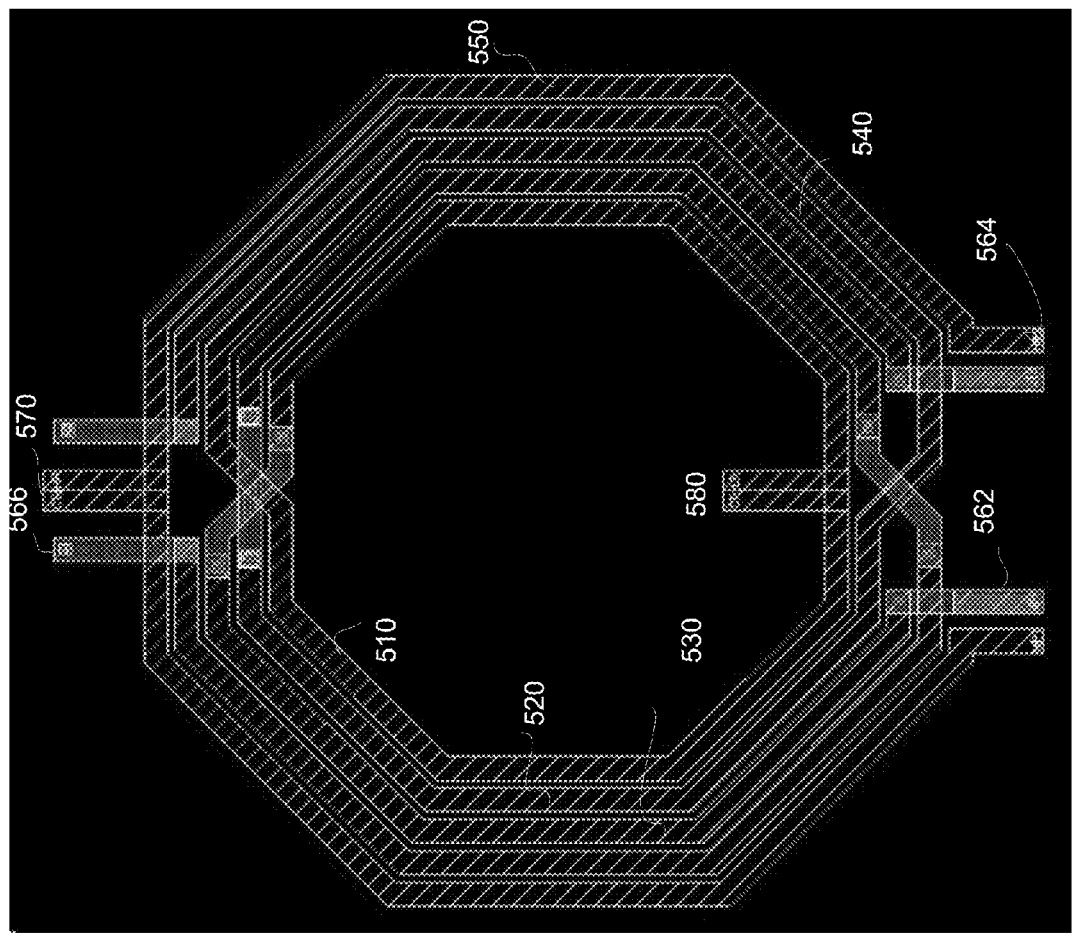
FIGS. 10-33 illustrate examples of asymmetrical parallel-combining transformers.
Figure 11:
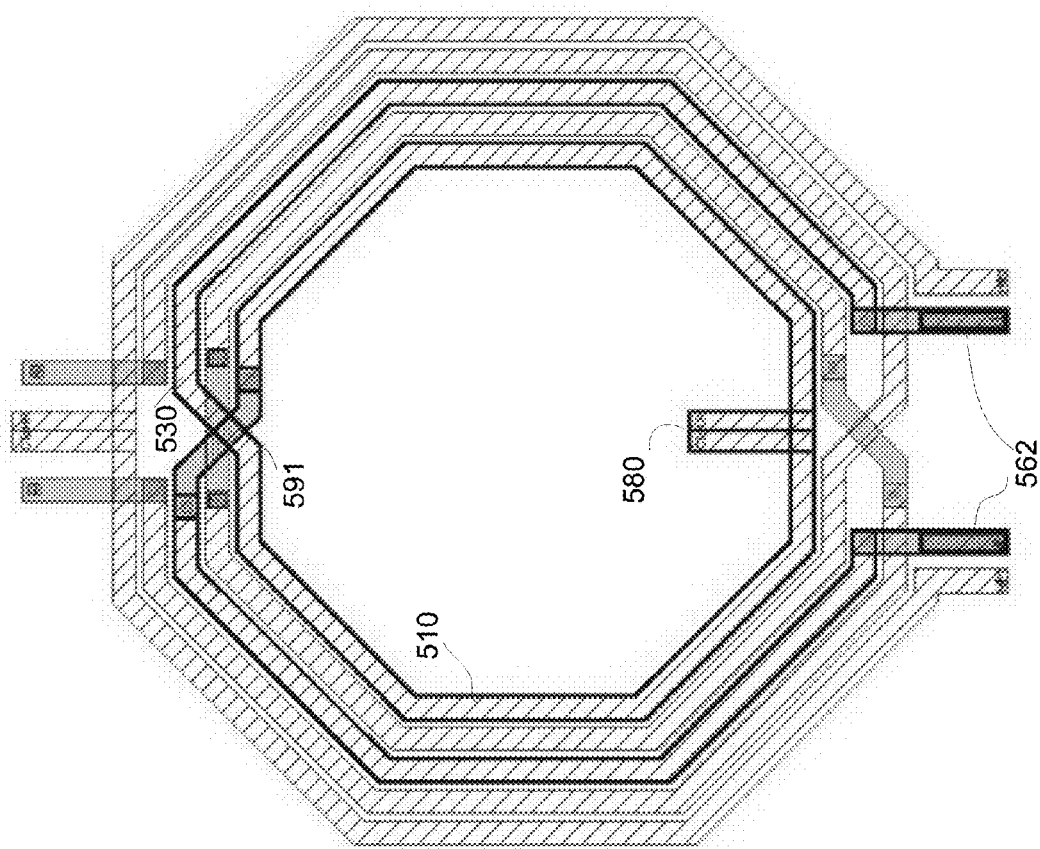
Figure 12:
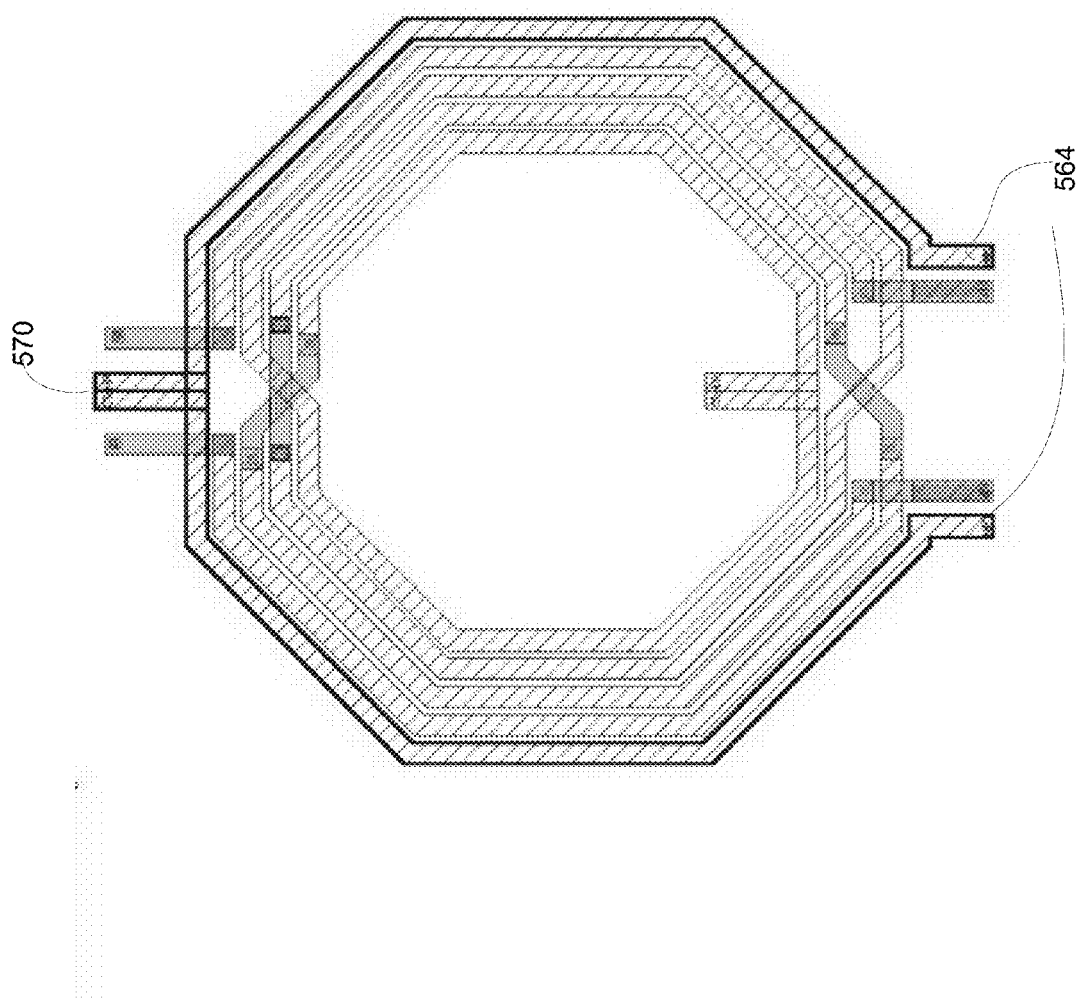
Figure 13:
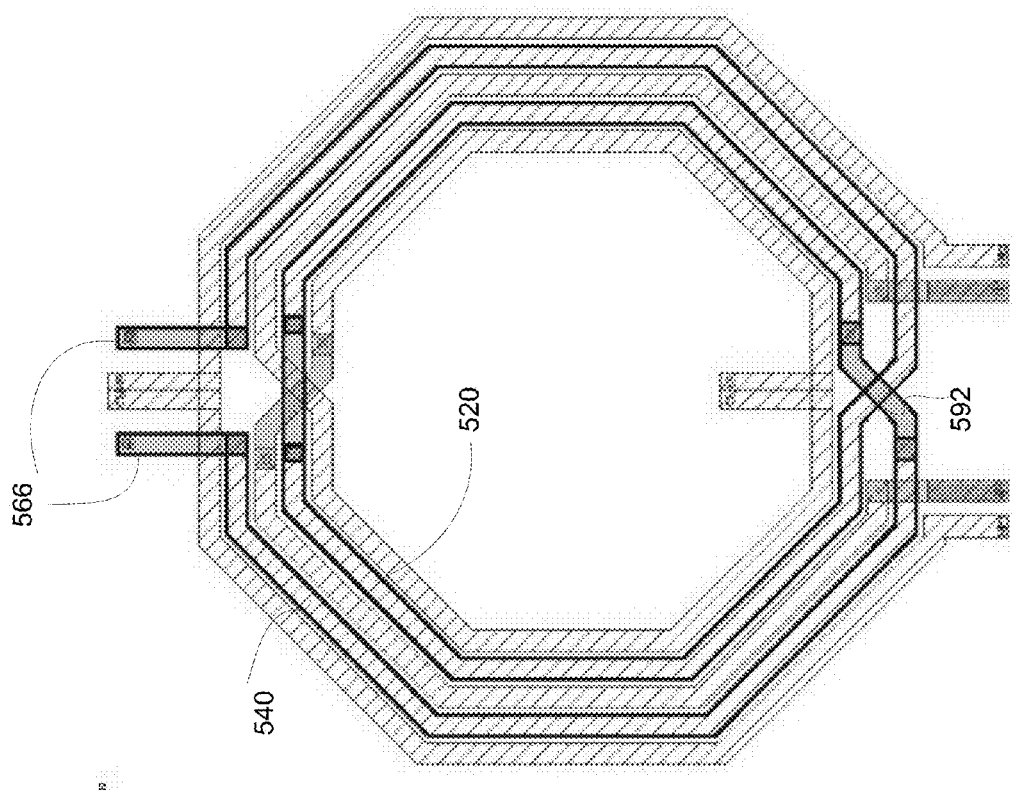

FIG. 10 illustrates an example of a first type of asymmetrical parallel-combining transformer. FIG. 11 illustrates an example of the LP primary windings, the LP input ports 562, and the LP power interface 580. FIG. 12 illustrates an example of the HP primary winding, the HP input ports and the HP power interface. FIG. 13 illustrates an example of the secondary winding and the secondary output ports.

First winding 510 is an inner LP primary winding, third winding 530 is an intermediate LP primary winding, and they are connected using LP windings interconnect 591. The LP power interface 580 is located at a first side of the asymmetrical parallel-combining transformer. The HP power interface 570 is located at a second side of the asymmetrical parallel-combining transformer. Fifth winding 550 is the external HP primary power winding. The second winding 520 and the fourth winding 540 are intermediate secondary windings.

The LP to HP primary windings ratio is 2:1.

LP primary winding to secondary winding ratio is 2:2.

The secondary windings to HP primary winding ratio is 2:1.

The LP power interface 580 is separated from the HP power interface 570.

Second Type

Figure 14:
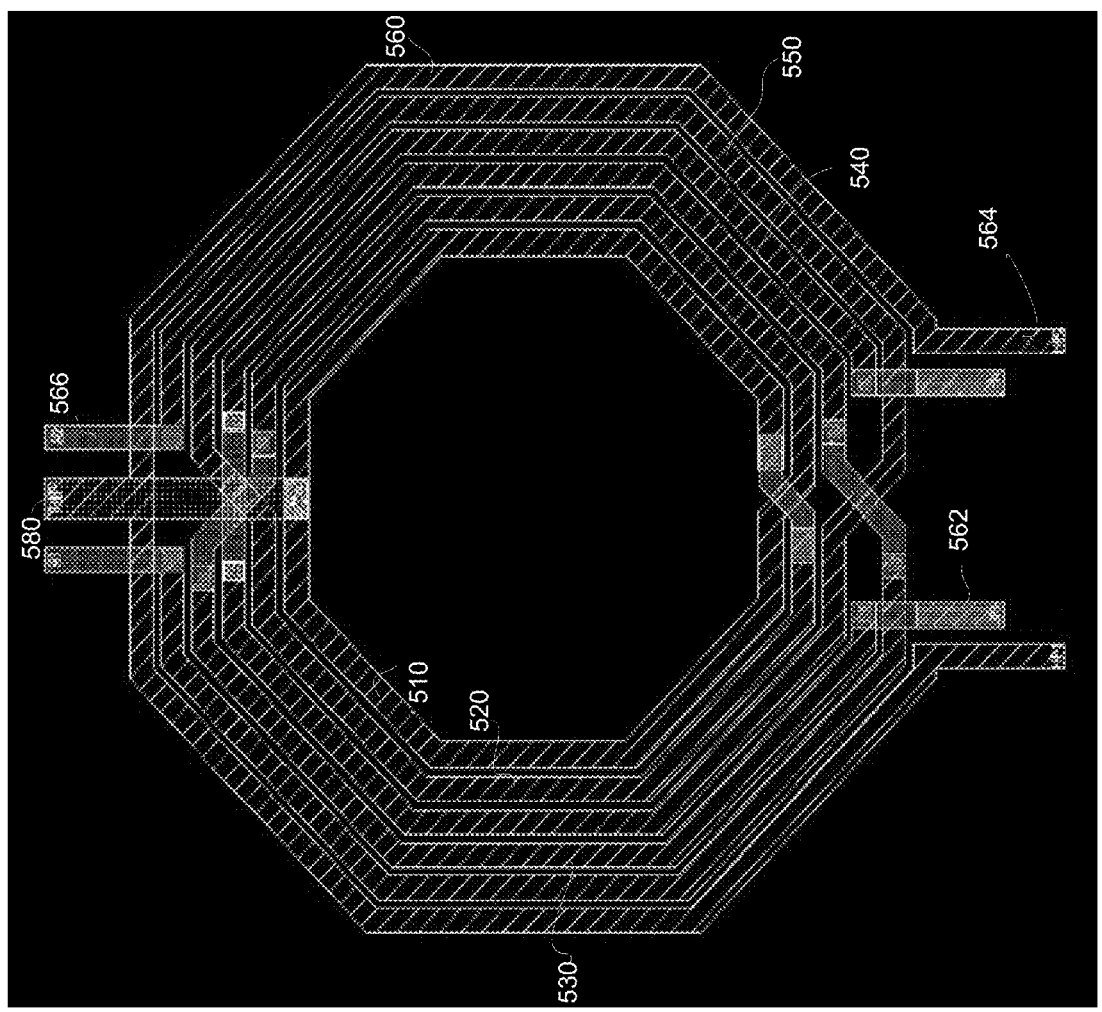
Figure 15:
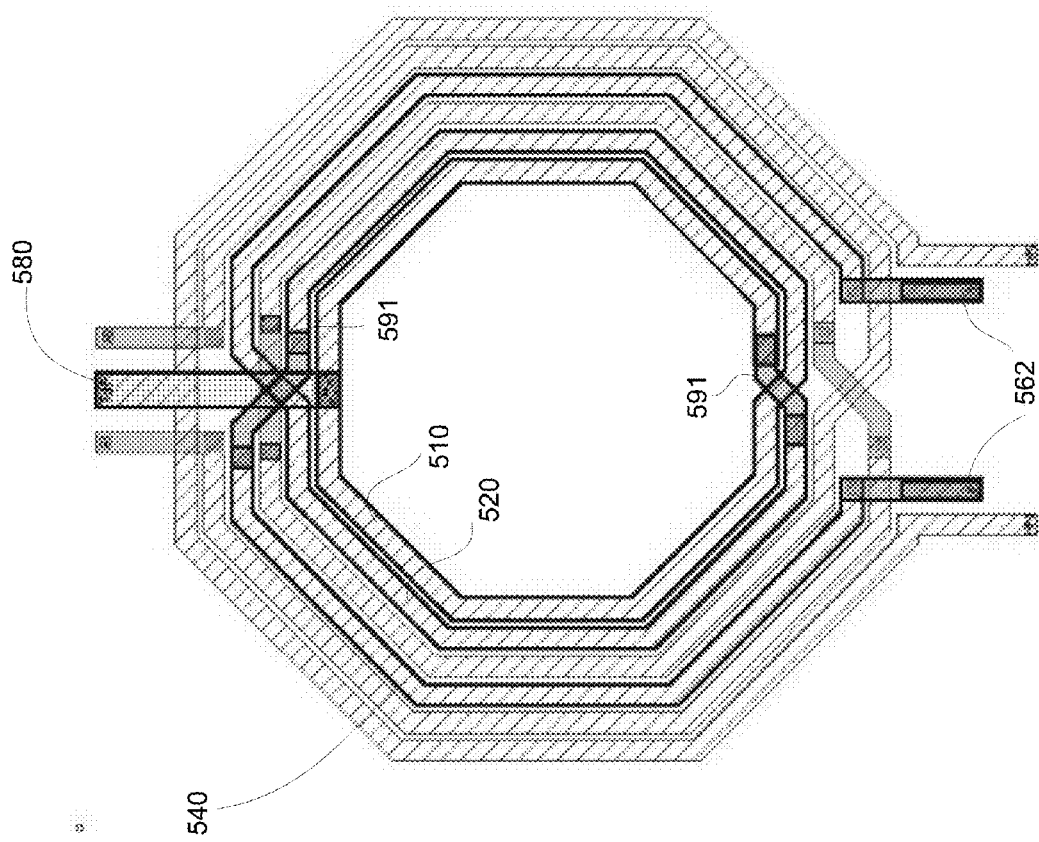
Figure 16:
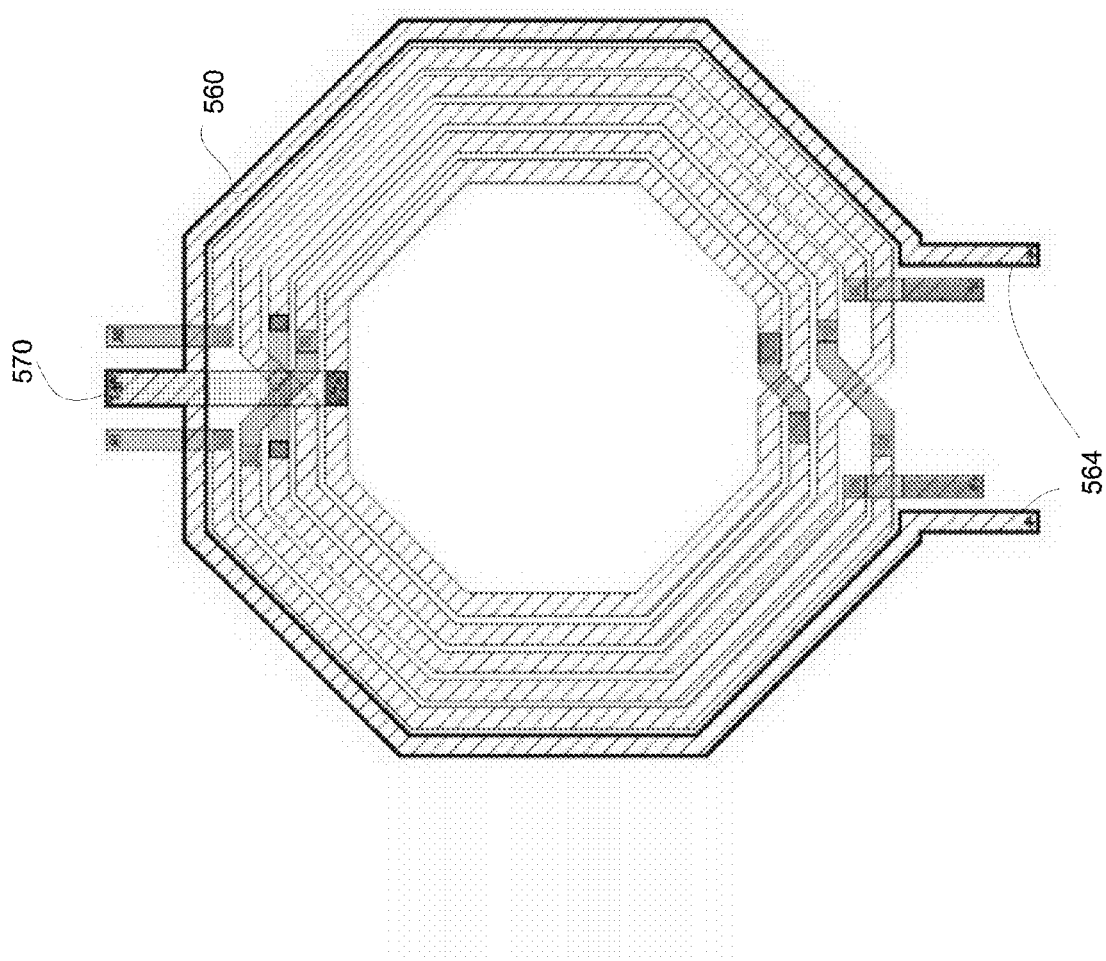
Figure 17:
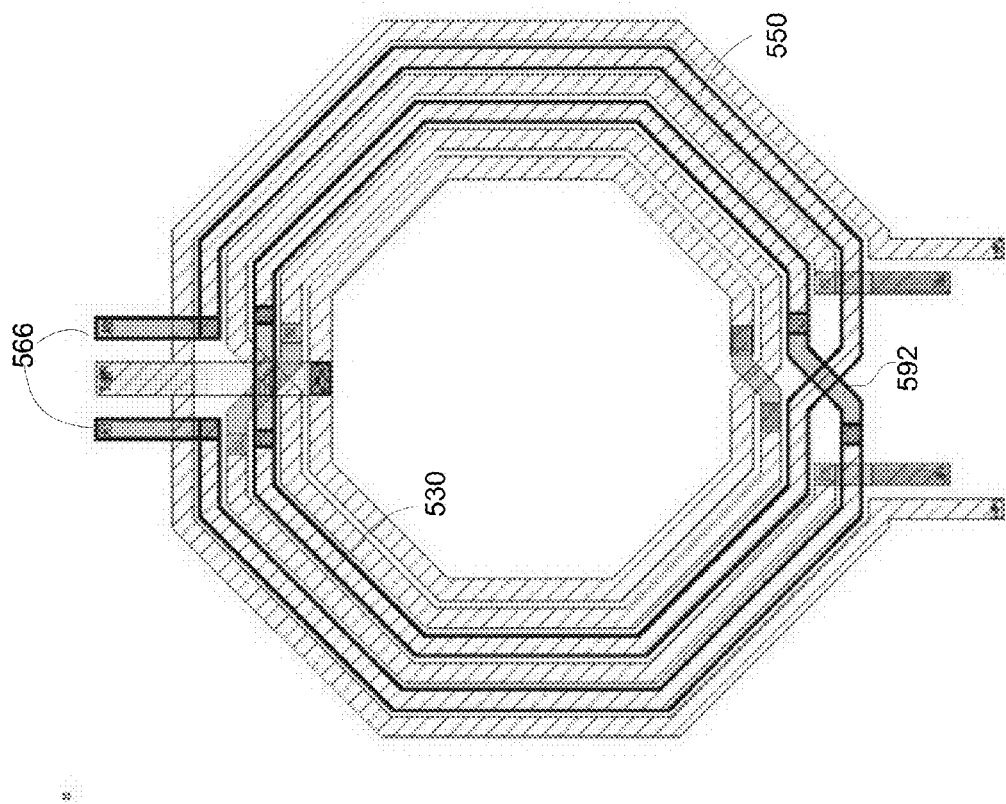

FIG. 14 illustrates an example of a second type of asymmetrical parallel-combining transformer. FIG. 15 illustrates an example of the LP primary windings, the LP input ports 562, and the LP power interface 580. FIG. 16 illustrates an example of the HP primary winding, the HP input ports and the HP power interface. FIG. 17 illustrates an example of the secondary winding and the secondary output ports.

First winding 510 is an inner LP primary winding, second winding 520 and fourth winding 540 are intermediate LP primary windings, and they are connected to each other using two LP windings interconnect 591. The LP power interface 580 is located at the second side of the asymmetrical parallel-combining transformer. The HP power interface 570 is located at a second side of the asymmetrical parallel-combining transformer. Sixth winding 560 is the external HP primary power winding. The third winding 530 and the fifth winding 550 are intermediate secondary windings.

The LP power interface 580 may be coupled to the HP power interface 570—or may share one or more parts.

The LP to HP primary windings ratio is 3:1.

LP primary winding to secondary winding ratio is 3:2.

The secondary windings to HP primary winding ratio is 2:1.

Third Type

Figure 18:
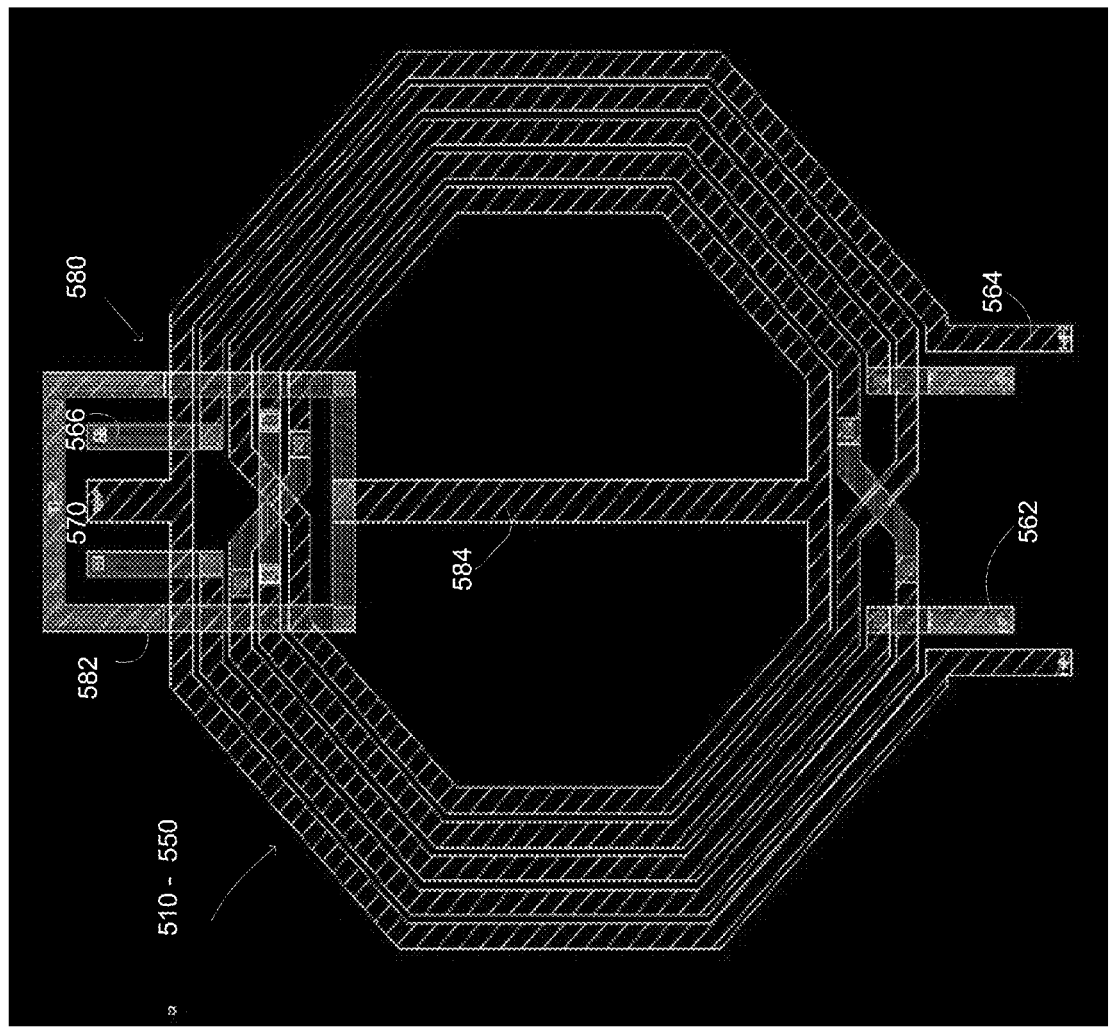
Figure 19:
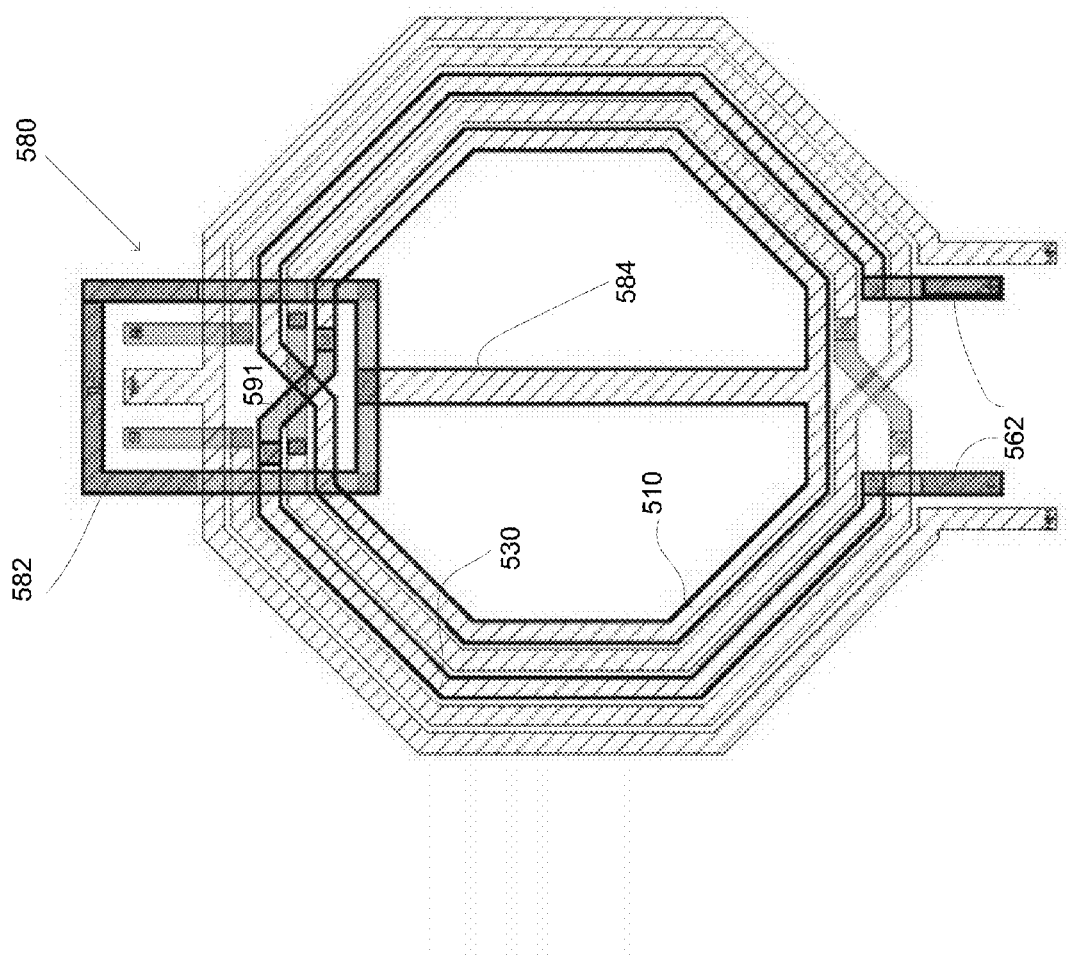
Figure 20:
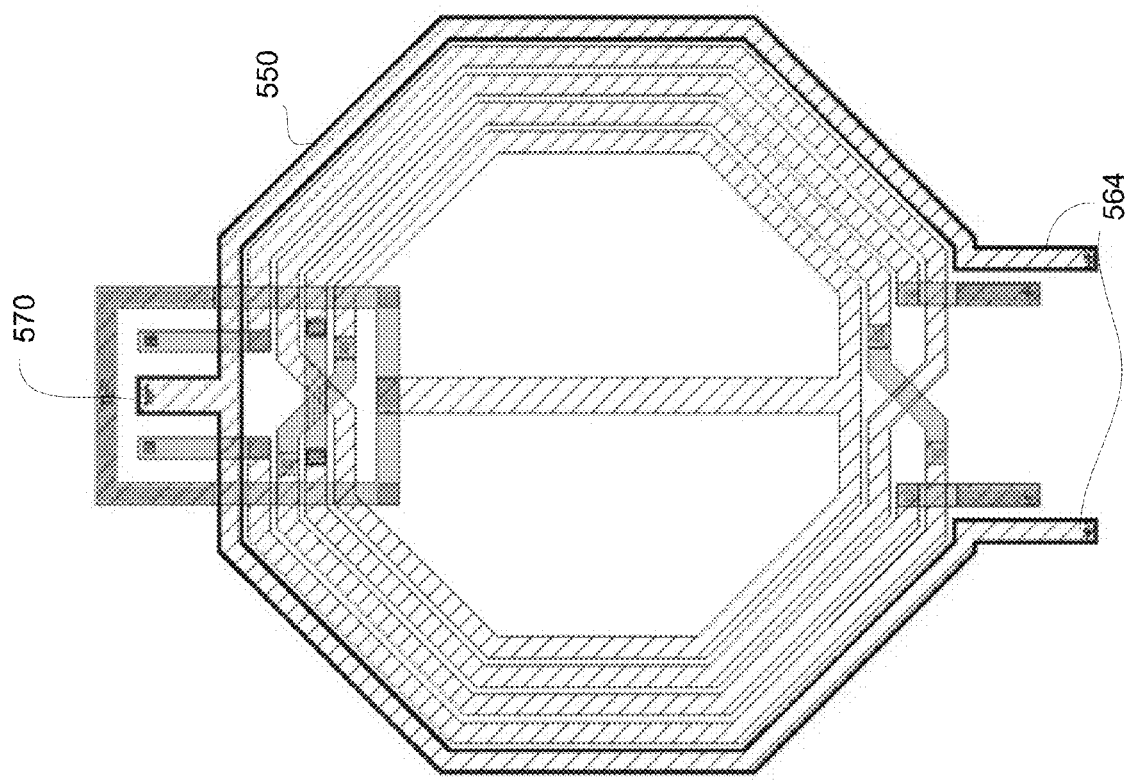
Figure 21:
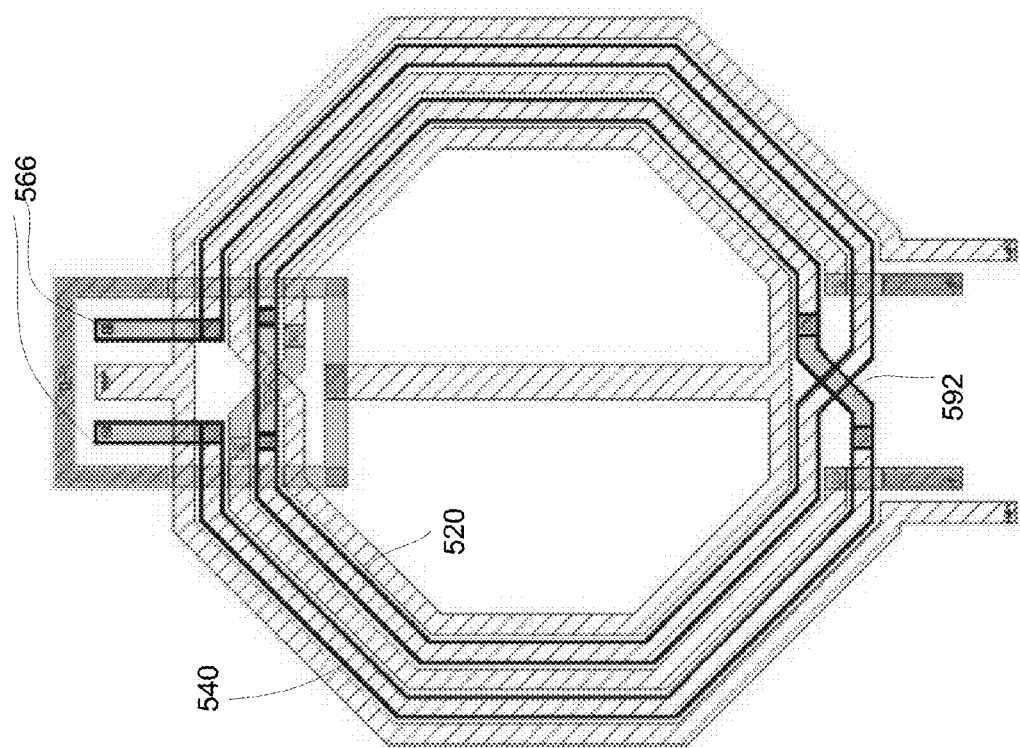

FIG. 18 illustrates an example of a third type of asymmetrical parallel-combining transformer. FIG. 19 illustrates an example of the LP primary windings, the LP input ports 562, and the LP power interface 580. FIG. 20 illustrates an example of the HP primary winding, the HP input ports and the HP power interface. FIG. 21 illustrates an example of the secondary winding and the secondary output ports.

First winding 510 is an inner LP primary winding, third winding 530 is an intermediate LP primary winding, and they are connected using LP windings interconnect 591. The LP power interface 580 includes frame 582 and a conductor 584. The frame 582 is located at the second side of the asymmetrical parallel-combining transformer, the frame is an input of the LP power interface. The frame virtually crosses the first till fifth windings. The conductor 584 is connected to the frame and is connected (at its output) to the first winding—for example to the middle of one of the segments of the first winding that is located at the first side of the asymmetrical parallel-combining transformer. The HP power interface 570 is located at the second side of the asymmetrical parallel-combining transformer. Fifth winding 550 is the external HP primary power winding. The second winding 520 and the fourth winding 540 are intermediate secondary windings—and are connected to each other via secondary windings interconnect 592.

The LP to HP primary windings ratio is 2:1.

LP primary winding to secondary winding ratio is 2:2.

The secondary windings to HP primary winding ratio is 2:1.

The LP power interface 580 may be coupled to the HP power interface 570—or may share one or more parts.

Fourth Type

Figure 22:
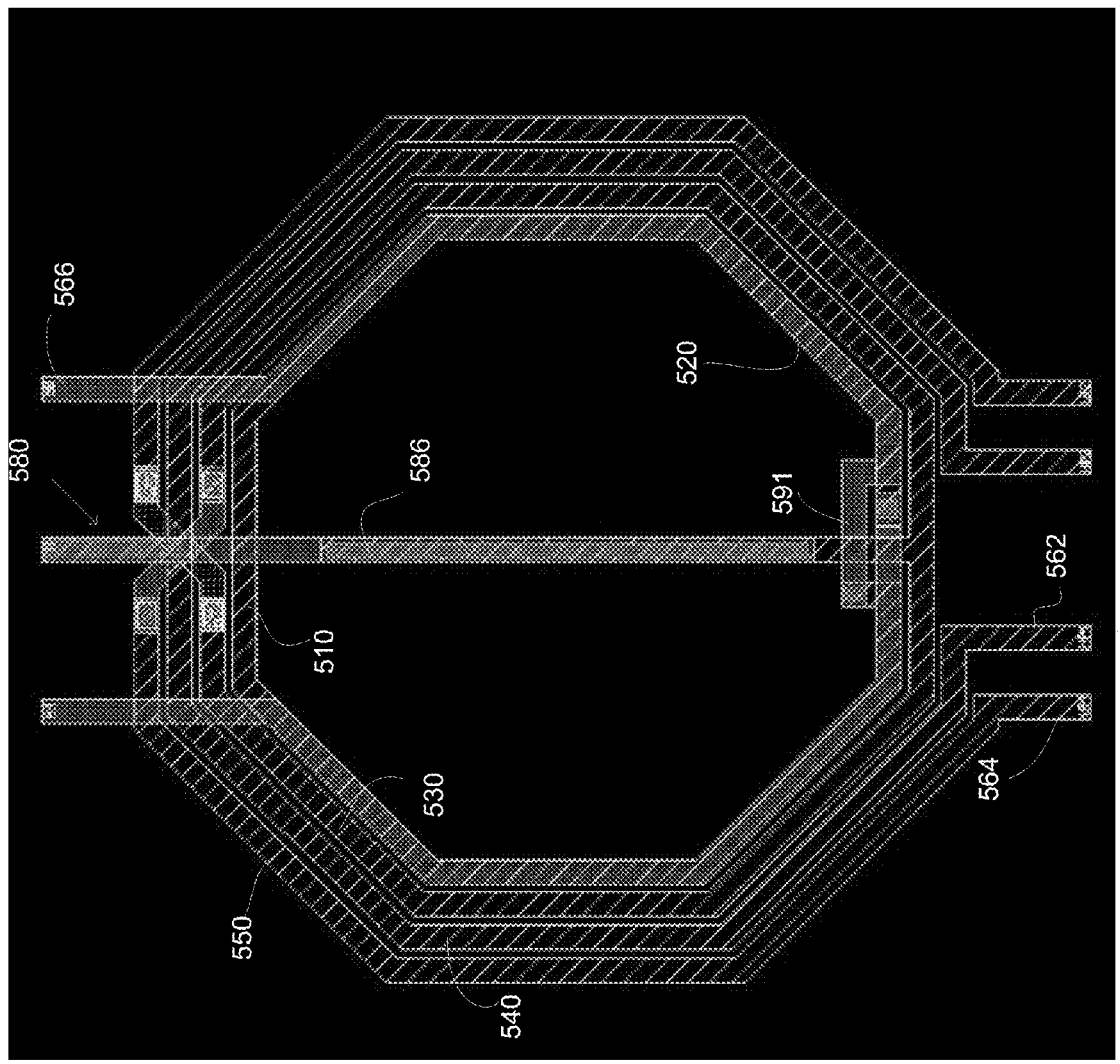
Figure 23:
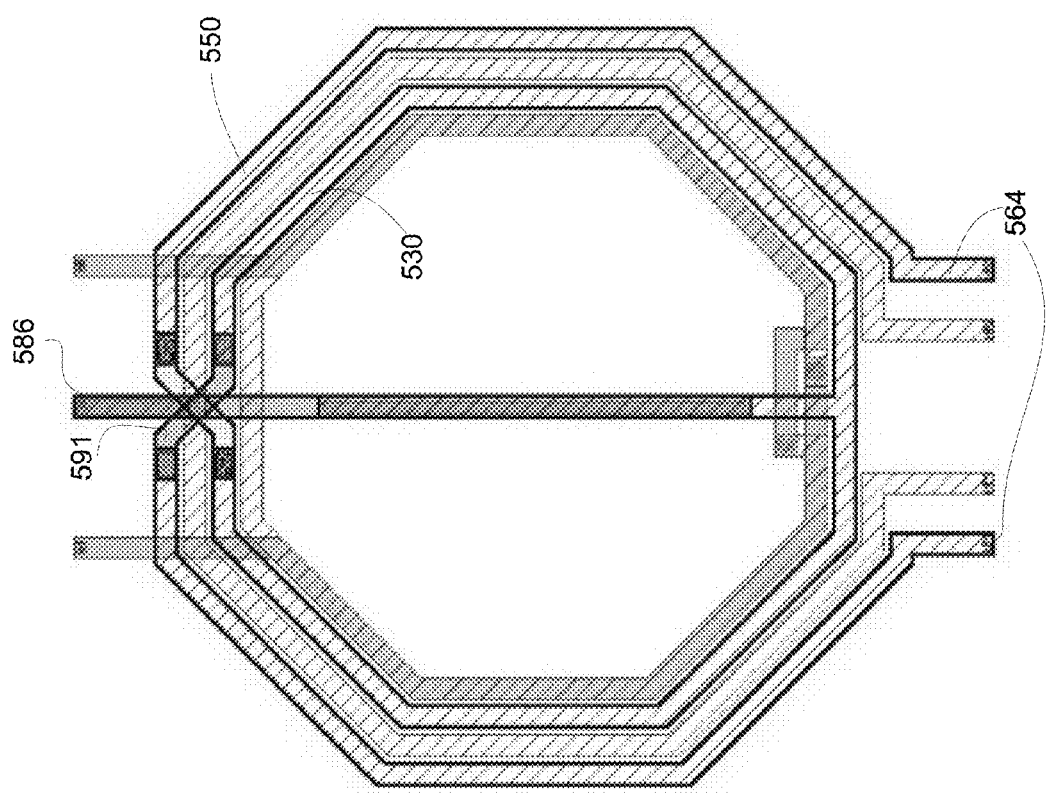
Figure 24:
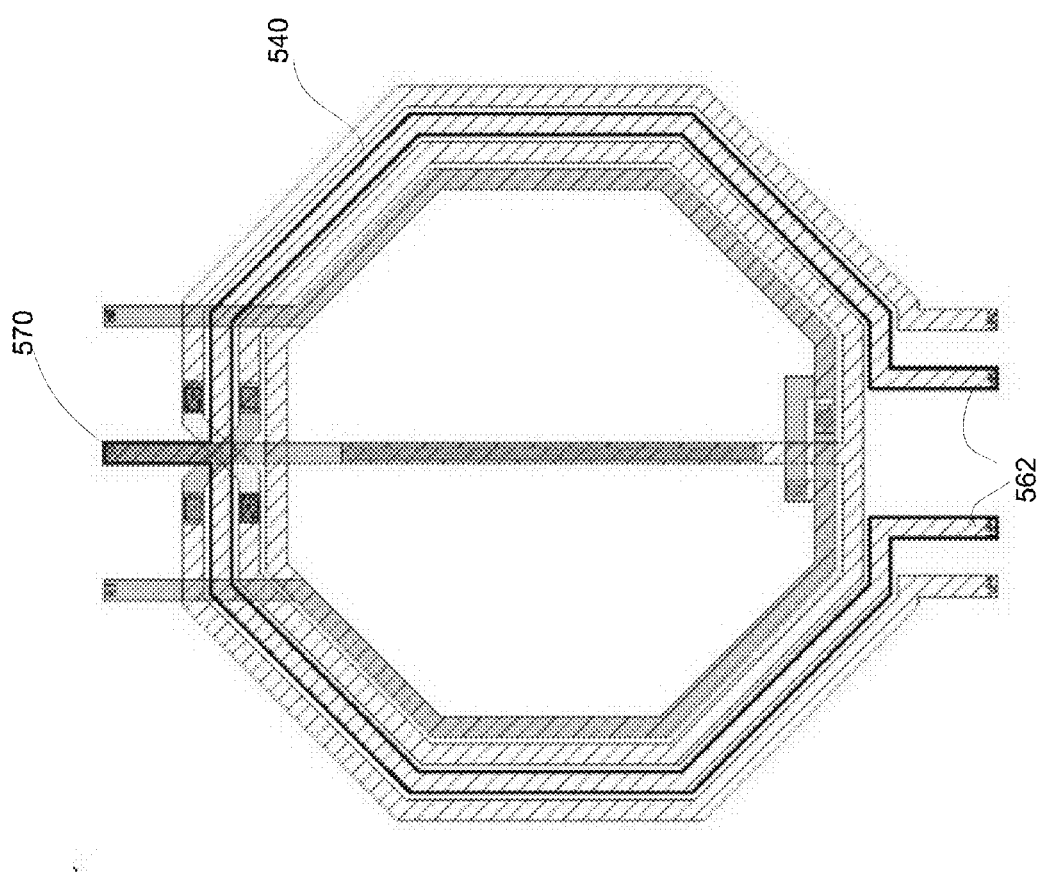
Figure 25:
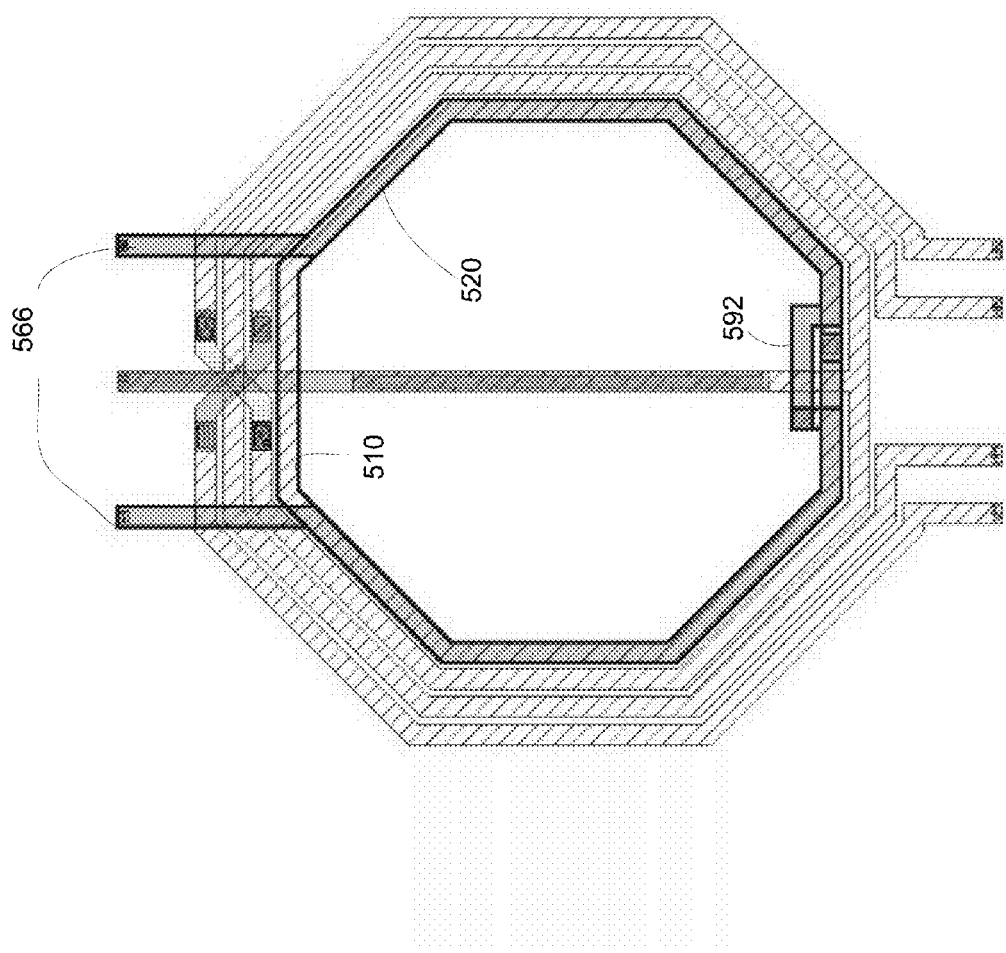

FIG. 22 illustrates an example of a fourth type of asymmetrical parallel-combining transformer. FIG. 23 illustrates an example of the LP primary windings, the LP input ports 562, and the LP power interface 580. FIG. 24 illustrates an example of the HP primary winding, the HP input ports and the HP power interface. FIG. 25 illustrates an example of the secondary winding and the secondary output ports.

Fifth winding 550 is an external LP primary winding, third winding 530 is an intermediate LP primary winding, and they are connected using LP windings interconnect 591. The LP power interface 586 includes a conductor that has an input at the second side of the asymmetrical parallel-combining transformer—and has an end at the first side of the asymmetrical parallel-combining transformer. The HP power interface 570 is located at the second side of the asymmetrical parallel-combining transformer. Fourth winding 540 is an intermediate HP primary power winding. The first winding 510 and the second winding 520 are located above each other are are both inner secondary windings and are connected to each other via secondary windings interconnect 592.

The LP to HP primary windings ratio is 2:1.

LP primary winding to secondary winding ratio is 2:2.

The secondary windings to HP primary winding ratio is 2:1.

The LP power interface 580 may be coupled to the HP power interface 570—or may share one or more parts.

Fifth Type

Figure 26:
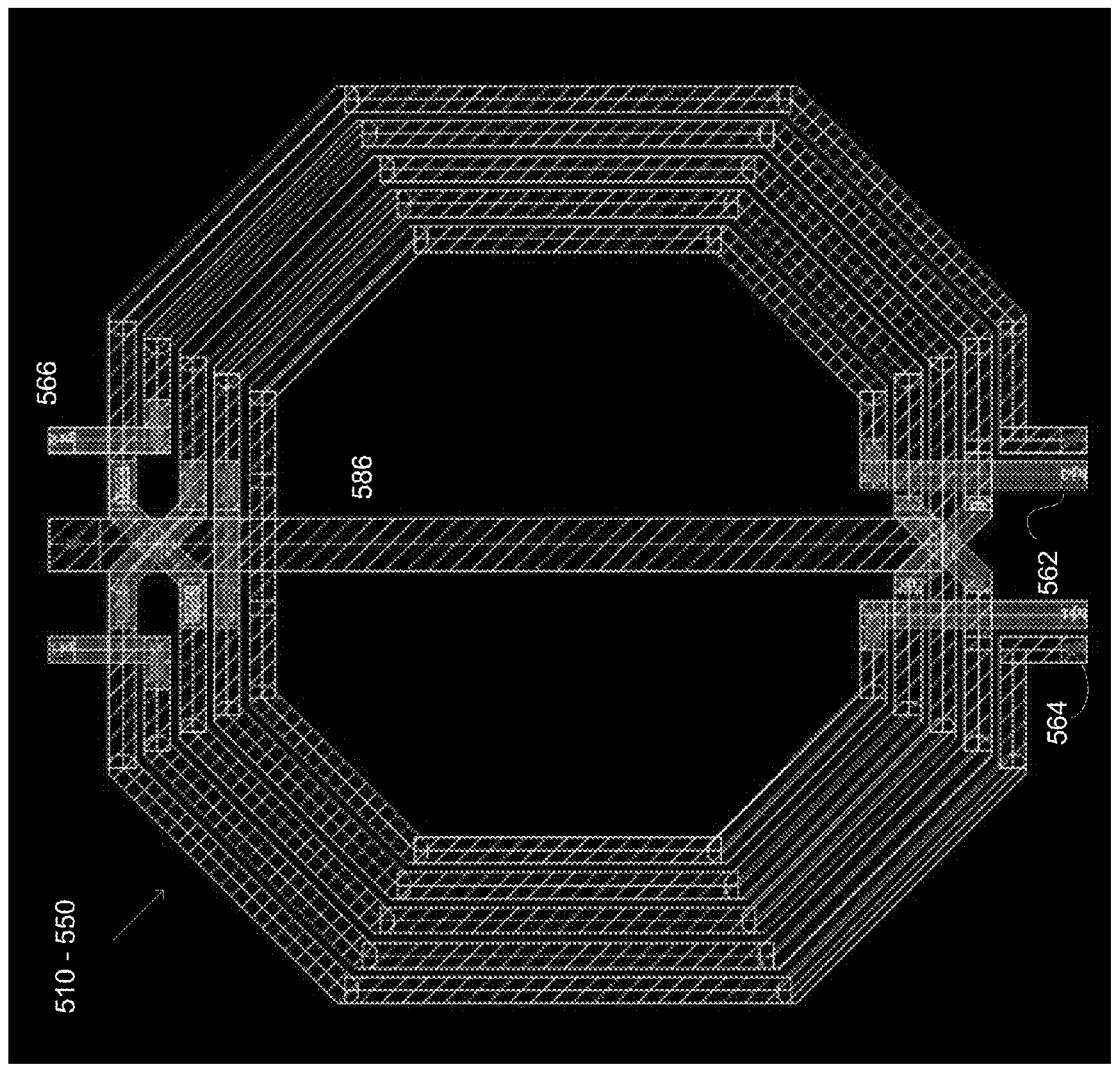
Figure 27:
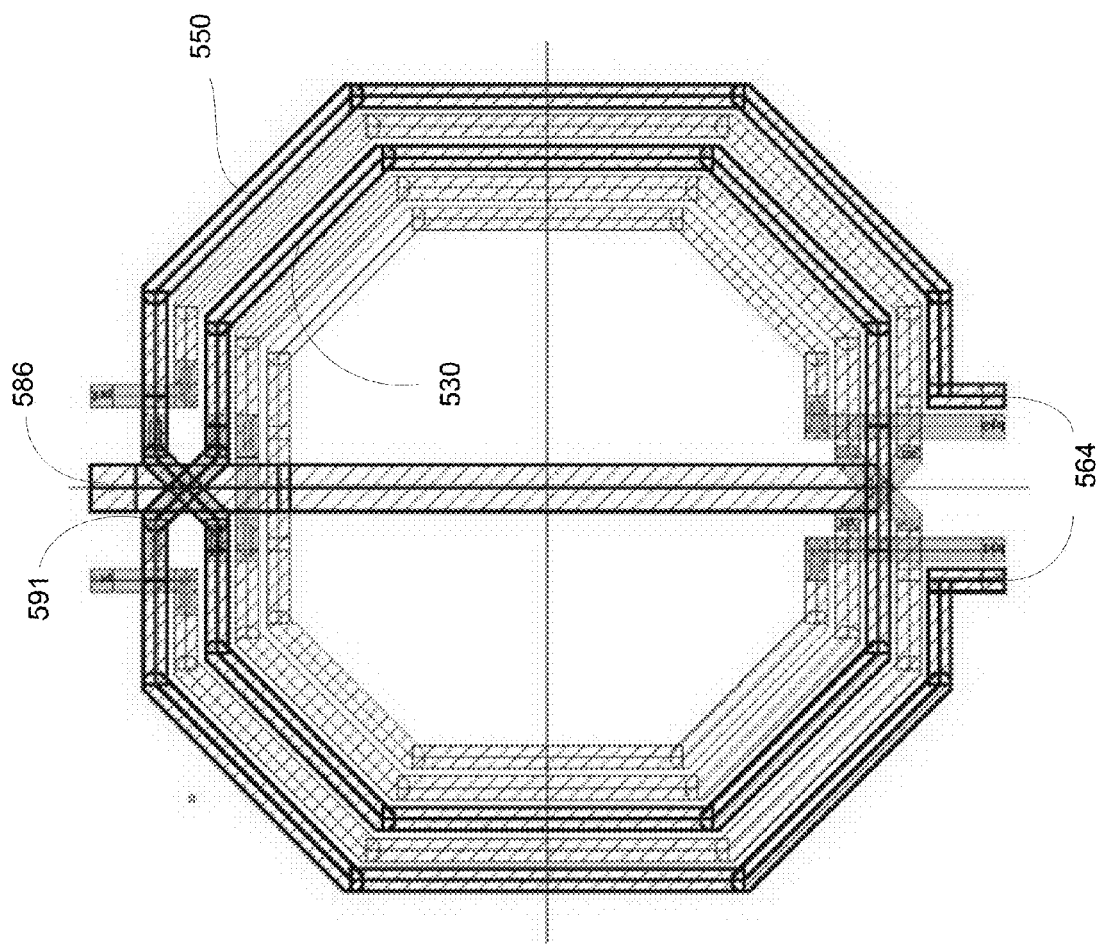
Figure 28:
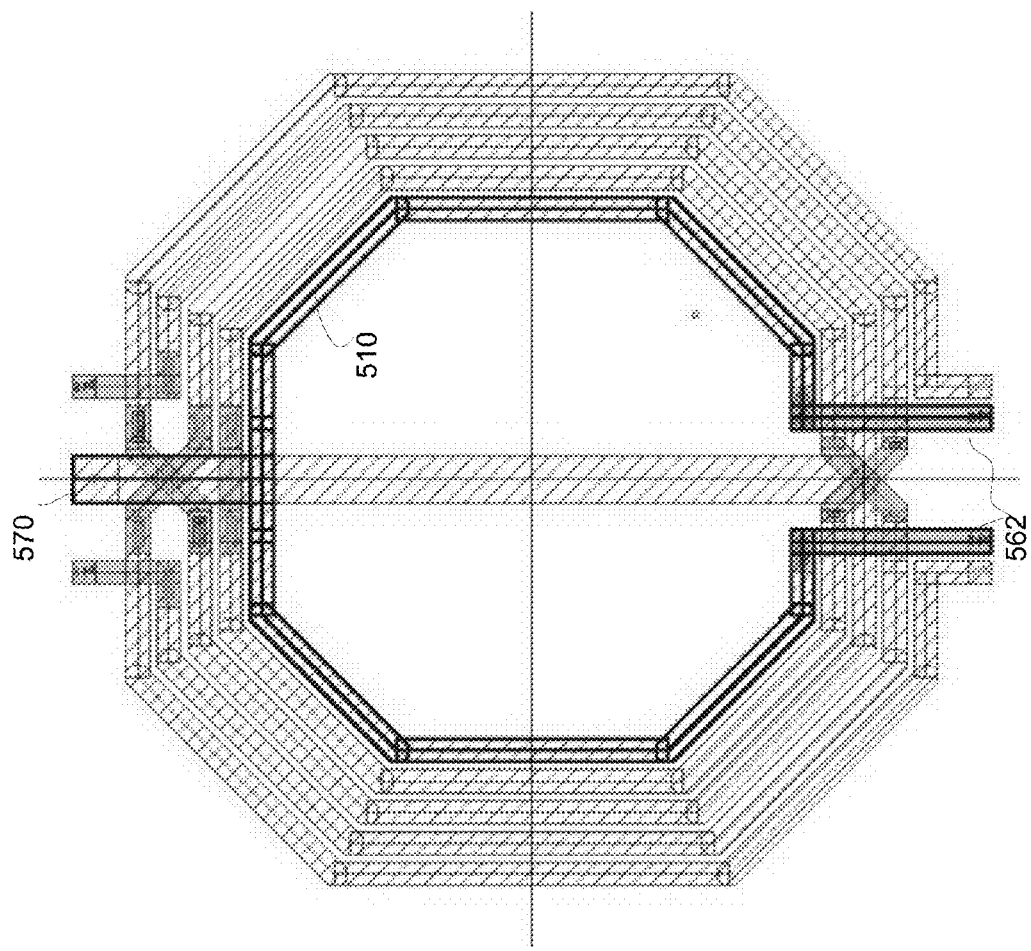
Figure 29:
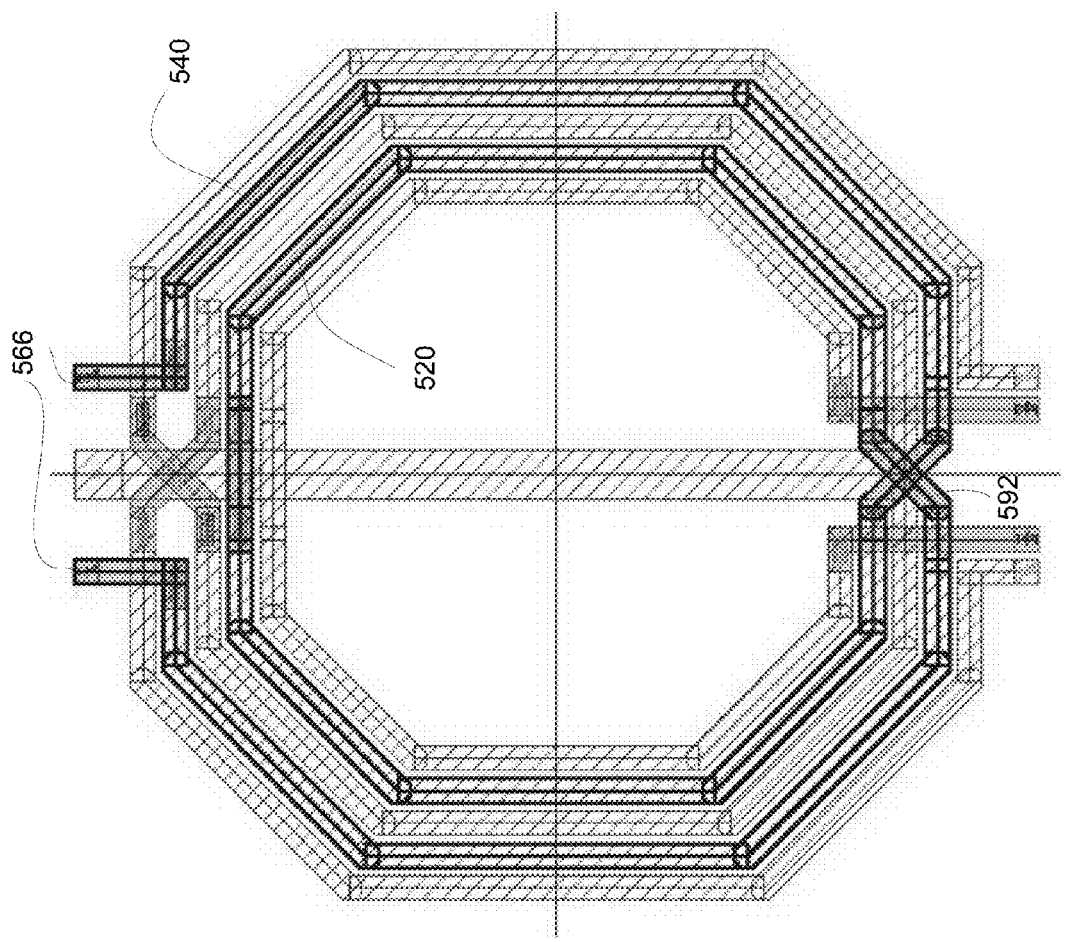

FIG. 26 illustrates an example of a fifth type of asymmetrical parallel-combining transformer. FIG. 27 illustrates an example of the LP primary windings, the LP input ports 562, and the LP power interface 580. FIG. 28 illustrates an example of the HP primary winding, the HP input ports and the HP power interface. FIG. 29 illustrates an example of the secondary winding and the secondary output ports.

Fifth winding 550 is an external LP primary winding, third winding 530 is an intermediate LP primary winding, and they are connected using LP windings interconnect 591. The LP power interface 586 includes a conductor that has an input at the second side of the asymmetrical parallel-combining transformer—and has an end at the first side of the asymmetrical parallel-combining transformer. The HP power interface 570 is located at the second side of the asymmetrical parallel-combining transformer. First winding 510 is the inner HP primary power winding. The second winding 520 and the fourth winding 540 are intermediate secondary windings and are connected to each other via secondary windings interconnect 592.

The LP to HP primary windings ratio is 2:1.

LP primary winding to secondary winding ratio is 2:2.

The secondary windings to HP primary winding ratio is 2:1.

The LP power interface 580 may be coupled to the HP power interface 570—or may share one or more parts.

Sixth Type

Figure 30:
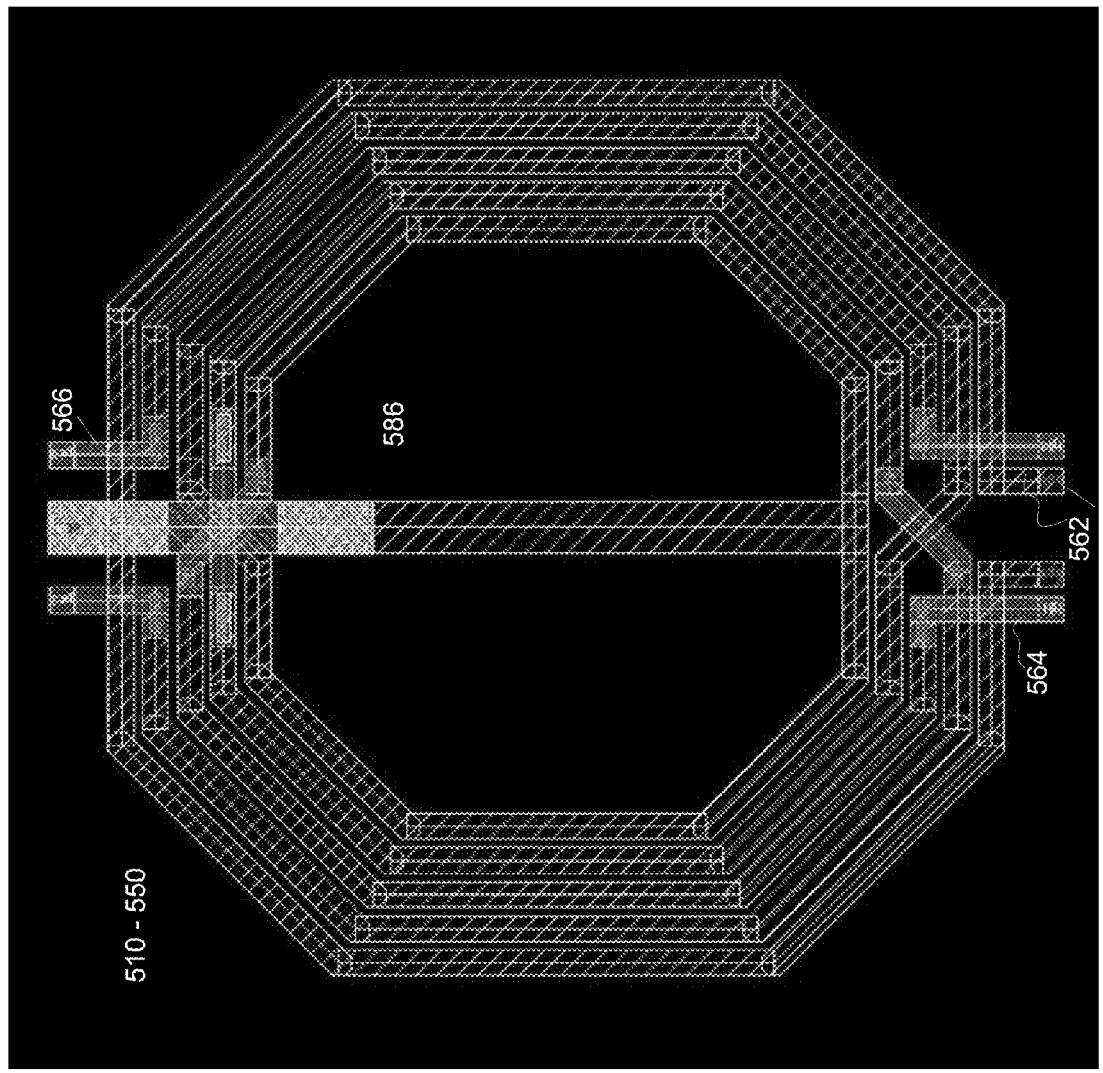
Figure 31:
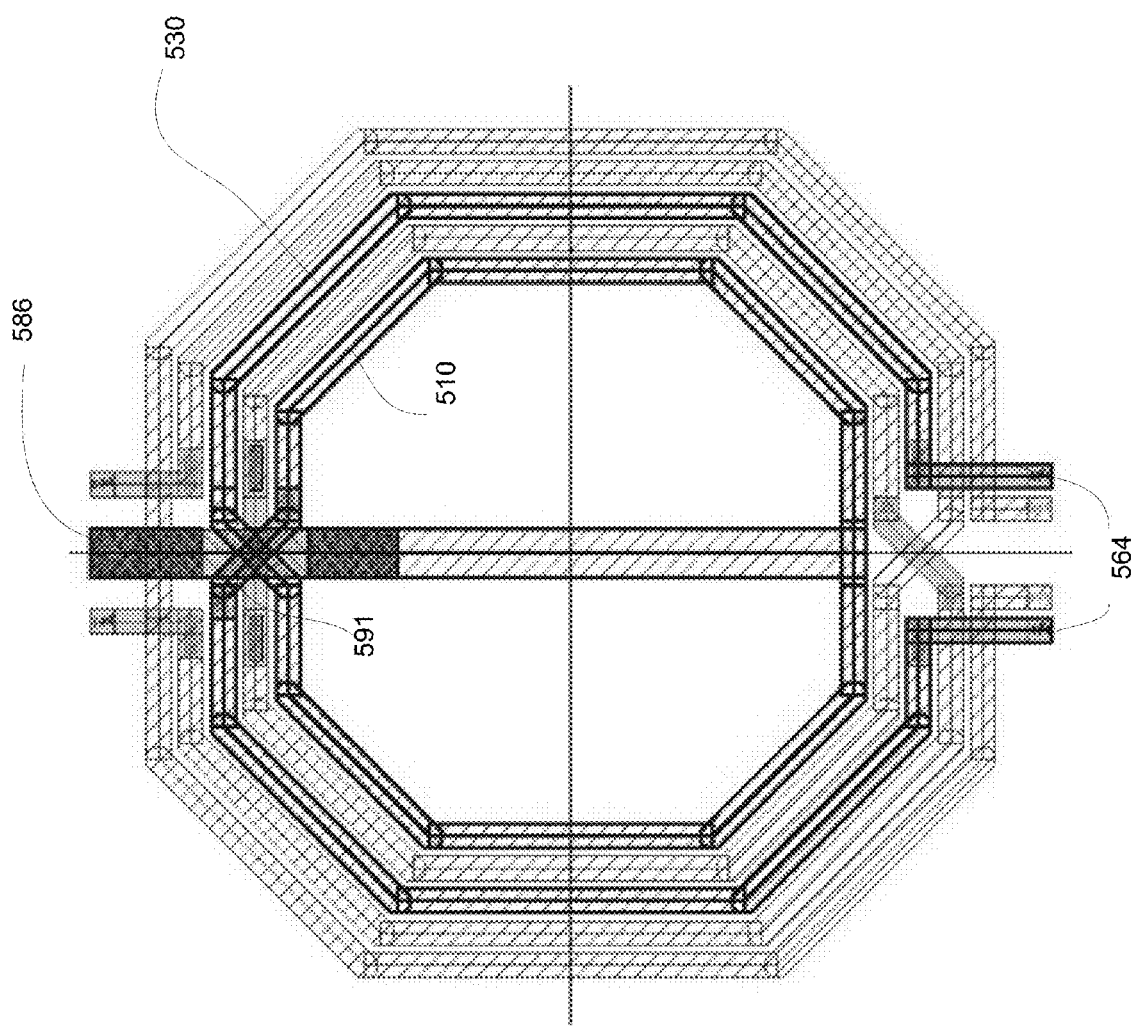
Figure 32:
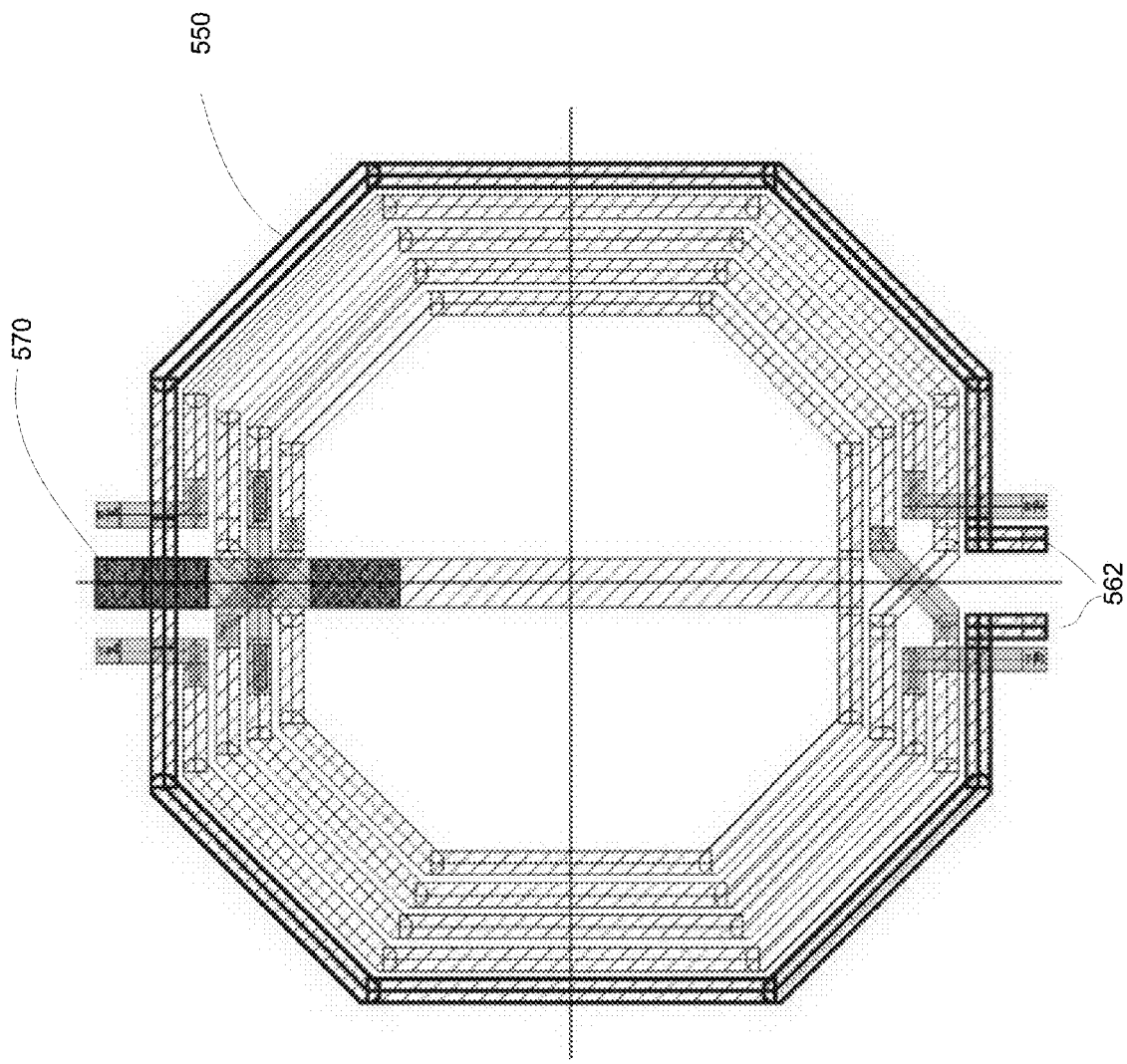
Figure 33:
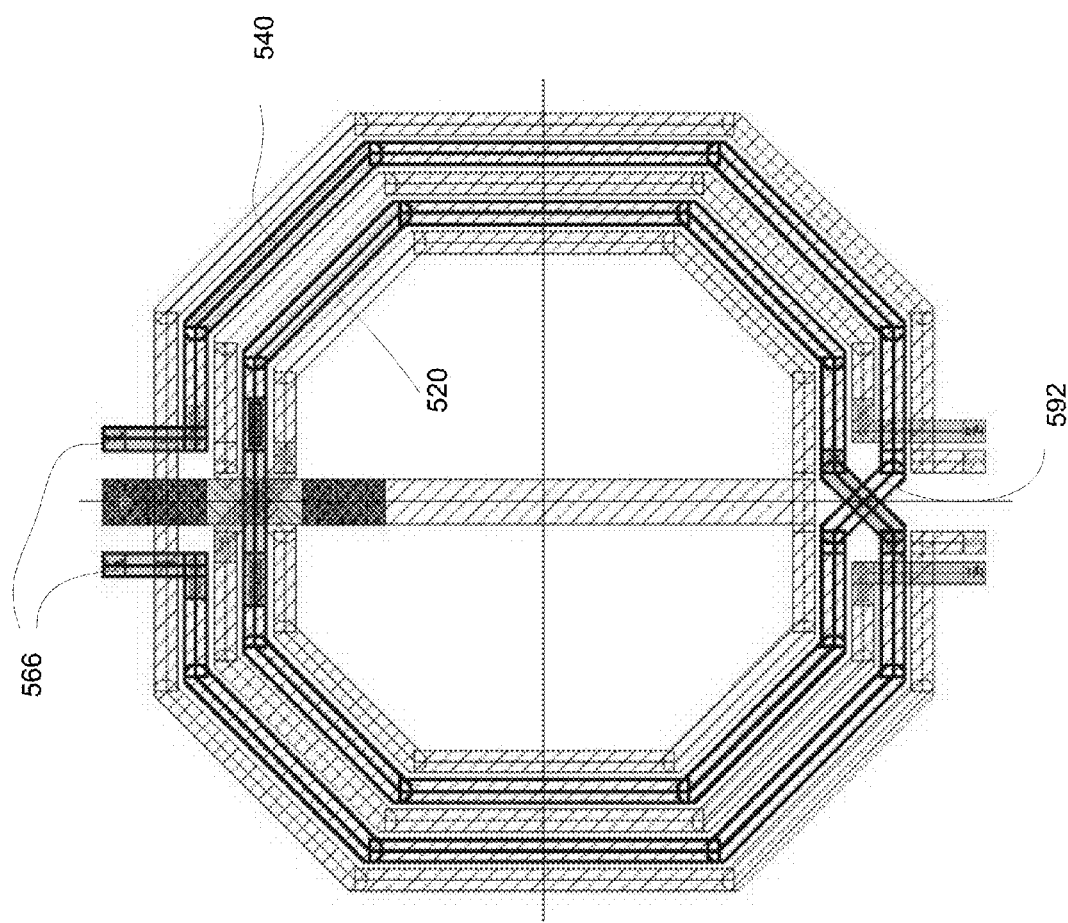

FIG. 30 illustrates an example of a first type of asymmetrical parallel-combining transformer. FIG. 31 illustrates an example of the LP primary windings, the LP input ports 562, and the LP power interface 580. FIG. 32 illustrates an example of the HP primary winding, the HP input ports and the HP power interface. FIG. 33 illustrates an example of the secondary winding and the secondary output ports.

First winding 510 is an inner LP primary winding, third winding 530 is an intermediate LP primary winding, and they are connected using LP windings interconnect 591. The LP power interface 586 includes a conductor that has an input at the second side of the asymmetrical parallel-combining transformer—and has an end at the first side of the asymmetrical parallel-combining transformer. The HP power interface 570 is located at the second side of the asymmetrical parallel-combining transformer. Fifth winding 550 is the external HP primary power winding. The second winding 520 and the fourth winding 540 are intermediate secondary windings and are connected to each other via secondary windings interconnect 592.

The LP to HP primary windings ratio is 2:1.

LP primary winding to secondary winding ratio is 2:2.

The secondary windings to HP primary winding ratio is 2:1.

The LP power interface 580 may be coupled to the HP power interface 570—or may share one or more parts.

Figure 35:
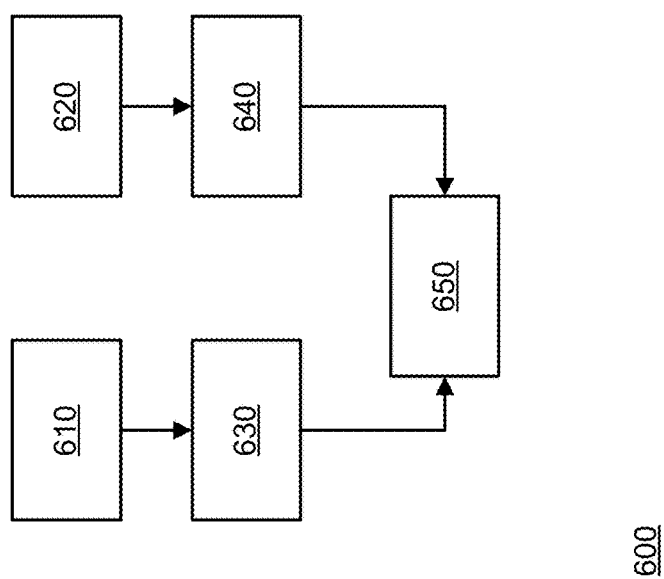
FIG. 35 illustrates an example of a method.

FIG. 35 illustrates method 600.

Method 600 include amplifying one or more RF signals by any of the power amplifiers illustrated above.

Method 600 includes:

Amplifying a low power (LP) RF input signal by a LP amplifier to provide a LP amplified signal. Step 610.

Amplifying a high power (HP) RF input signal by a HP amplifier to provide a HP amplified signal. The HP amplified signal has maximal intensity that exceeds a maximal intensity of the LP amplified signal. Step 620.

Providing the HP amplified signal to HP primary winding of an asymmetrical parallel-combining transformer. Step 620.

Providing the LP amplified signal to LP primary winding of the asymmetrical parallel-combining transformer. Step 630.

Outputting an output signal, in response to the provision of the HP amplified signal and to provision of the LP amplified signal, by secondary windings of the asymmetrical parallel-combining transformer that are magnetically coupled to the HP primary winding and to the LP primary windings. Step 640.

Any combination of any steps of any method may be provided.

The terms "comprising", "having", "including", "consisting of" and "consisting essentially of" are used in an interchangeable manner. Any reference to any of these terms should be applicable mutatis mutandis to any other of these terms.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations, and alternatives are also possible. The specifications and drawings are, accordingly, to be regarded in an illustrative rather than in a restrictive sense.

The word "comprising" does not exclude the presence of other elements or steps then those listed in a claim. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. An integrated circuit radio frequency (RF) power amplifier, comprising:
   a substrate;
   a low power (LP) amplifier;
   a high-power (HP) amplifier; and
   an asymmetrical parallel-combining transformer;
   wherein the substrate is configured to supports the LP amplifier, the HP amplifier and the asymmetrical parallel-combining transformer;
   wherein the LP amplifier is configured to amplify a LP RF input signal to provide a LP amplified signal;
   wherein the HP amplifier is configured to amplify a HP RF input signal to provide a HP amplified signal;
   wherein the HP amplified signal has maximal intensity that exceeds a maximal intensity of the LP amplified signal;
   wherein the asymmetrical parallel-combining transformer comprises:
   (a) a HP primary winding that is constructed and arranged to receive the HP amplified signal;
   (b) LP primary windings that are constructed and arranged to receive the LP amplified signal; and
   (c) secondary windings that are magnetically coupled to the HP primary winding and to the LP primary windings, and are constructed and arranged to output a output signal;
   wherein the HP primary winding surrounds the LP primary windings and the secondary windings.

2. The integrated circuit according to claim 1 wherein the LP amplifier and the HP amplifier are independently biased.

3. The integrated circuit according to claim 2 wherein the LP amplifier comprises a pair of LP amplification branches for amplifying the LP RF input signal; wherein the HP amplifier HP comprises a pair of HP amplification branches for amplifying the HP RF input signal; wherein the pair of LP amplification branches are independently biased; and wherein the pair of HP amplification branches are independently biased.

4. The integrated circuit RF power amplifier according to claim 1 wherein the HP primary winding, the LP primary windings, and the secondary windings surround an internal area.

5. An integrated circuit radio frequency (RF) power amplifier, comprising:
   a substrate;
   a low power (LP) amplifier;
   a high-power (HP) amplifier; and
   an asymmetrical parallel-combining transformer;
   wherein the substrate is configured to supports the LP amplifier, the HP amplifier and the asymmetrical parallel-combining transformer;
   wherein the LP amplifier is configured to amplify a LP RF input signal to provide a LP amplified signal;
   wherein the HP amplifier is configured to amplify a HP RF input signal to provide a HP amplified signal;
   wherein the HP amplified signal has maximal intensity that exceeds a maximal intensity of the LP amplified signal;
   wherein the asymmetrical parallel-combining transformer comprises:
   (a) a HP primary winding that is constructed and arranged to receive the HP amplified signal;
   (b) LP primary windings that are constructed and arranged to receive the LP amplified signal; and (c) secondary windings that are magnetically coupled to the HP primary winding and to the LP primary windings, and are constructed and arranged to output a output signal; and wherein the HP primary winding, the LP primary windings, and the secondary windings are located on a same layer.

6. The integrated circuit RF power amplifier according to claim 1 wherein at least two windings of the HP primary winding, the LP primary windings, and secondary windings are located at different layers.

7. The integrated circuit RF power amplifier according to claim 5 wherein the HP primary winding surrounds the LP primary windings and the secondary windings.

8. The integrated circuit RF power amplifier according to claim 1 wherein the LP primary windings comprise an inner LP primary winding and an intermediate LP primary winding; wherein the inner LP primary winding is surrounded by the secondary windings and by the intermediate LP primary winding.

9. The integrated circuit RF power amplifier according to claim 8 wherein the LP primary windings are a pair of LP primary windings, and the secondary windings are a pair of secondary windings.

10. The integrated circuit RF power amplifier according to claim 9 comprising (a) a LP power interface that is constructed and arranged to supply power to the LP primary windings; and (b) a HP power interface that is constructed and arranged to feed power to the HP primary winding; wherein the LP power interface is located at a first side of the asymmetrical parallel-combining transformer; and wherein the HP power interface is located at a second side of the asymmetrical parallel-combining transformer.

11. The integrated circuit RF power amplifier according to claim 9 comprising (a) a LP power interface that is constructed and arranged to supply power to the LP primary windings; and (b) a HP power interface that is constructed and arranged to feed power to the HP primary winding; wherein the LP power interface has an input located at a first side of the asymmetrical parallel-combining transformer and has an output located at a second side of the LP primary windings; and wherein the HP power interface is located at a second side of the asymmetrical parallel-combining transformer.

12. The integrated circuit RF power amplifier according to 11 wherein the LP power interface is a conductor.

13. The integrated circuit according to claim 12 wherein a vertical projection, on the substrate, of the conductor partially overlaps a vertical projection, on the substrate, of a winding out of the HP primary winding, the LP primary windings and the secondary windings.

14. The integrated circuit RF power amplifier according to 11 wherein the LP power interface comprises a frame that is connected to a conductor.

15. The integrated circuit according to claim 12 wherein a vertical projection, on the substrate, of the frame partially overlaps a vertical projection, on the substrate, of a winding out of the HP primary winding, the LP primary windings and the secondary windings.

16. The integrated circuit RF power amplifier according to claim 8 wherein the LP primary windings are three LP primary windings, and the secondary windings are a pair of secondary windings.

17. The integrated circuit RF power amplifier according to claim 16 comprising (a) a LP power interface that is constructed and arranged to supply power to the LP primary windings; and (b) a HP power interface that is constructed and arranged to feed power to the HP primary winding; wherein the LP power interface and the HP power interface are located at a first side of the asymmetrical parallel-combining transformer.

18. The integrated circuit RF power amplifier according to claim 1 wherein the LP primary windings comprise an external LP primary winding and an intermediate LP primary winding; wherein the external LP primary winding surrounds the HP primary winding, the intermediate LP primary winding and the secondary windings.

19. The integrated circuit RF power amplifier according to claim 18 wherein the LP secondary windings comprise an inner secondary winding and an intermediate secondary winding; wherein the inner secondary winding is surrounded by the intermediate secondary winding, the HP primary winding and the the intermediate LP primary winding.

* * * * *